(12) United States Patent
Cappellani et al.

(10) Patent No.: US 9,691,843 B2
(45) Date of Patent: *Jun. 27, 2017

(54) COMMON-SUBSTRATE SEMICONDUCTOR DEVICES HAVING NANOWIRES OR SEMICONDUCTOR BODIES WITH DIFFERING MATERIAL ORIENTATION OR COMPOSITION

(71) Applicant: Intel Corporation, Santa Clara, CA (US)

(72) Inventors: Annalisa Cappellani, Portland, OR (US); Peter G. Tolchinsky, Beaverton, OR (US); Kelin J. Kuhn, Aloha, OR (US); Glenn A. Glass, Beaverton, OR (US); Van H. Le, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/996,038

(22) Filed: Jan. 14, 2016

(65) Prior Publication Data

US 2016/0133735 A1    May 12, 2016

Related U.S. Application Data

(63) Continuation of application No. 13/996,506, filed as application No. PCT/US2011/067242 on Dec. 23, 2011, now Pat. No. 9,559,160.

(51) Int. Cl.
*H01L 29/04* (2006.01)
*H01L 29/66* (2006.01)
(Continued)

(52) U.S. Cl.
CPC ............ *H01L 29/045* (2013.01); *B82Y 10/00* (2013.01); *B82Y 40/00* (2013.01);
(Continued)

(58) Field of Classification Search
CPC ............ H01L 29/045; H01L 29/66439; H01L 29/775; H01L 29/0673; H01L 29/78687;
(Continued)

(56) References Cited

U.S. PATENT DOCUMENTS 7,456,055 B2    11/2008  Orlowski et al.
9,559,160 B2 *   1/2017  Cappellani ........ H01L 29/66439
(Continued)

FOREIGN PATENT DOCUMENTS

| CN | 101075616 | 11/2007 | |
|---|---|---|---|
| CN | 101075616 A * | 11/2007 | ........... H01L 27/088 |

(Continued)

OTHER PUBLICATIONS

International Search Report and Written Opinion for PCT Patent Application No. PCT/US2011/067242 Mailed Sep. 17, 2012, 14 pgs.

(Continued)

*Primary Examiner* — Victoria K Hall
(74) *Attorney, Agent, or Firm* — Biakely, Sokoloff, Taylor & Zafman LLP

(57) ABSTRACT

Common-substrate semiconductor devices having nanowires or semiconductor bodies with differing material orientation or composition and methods to form such common-substrate devices are described. For example, a semiconductor structure includes a first semiconductor device having a first nanowire or semiconductor body disposed above a crystalline substrate. The first nanowire or semiconductor body is composed of a semiconductor material having a first global crystal orientation. The semiconductor structure also includes a second semiconductor device having a second nanowire or semiconductor body disposed above the crystalline substrate. The second nanowire or semiconductor body is composed of a semiconductor mate- (Continued)

rial having a second global crystal orientation different from the first global orientation. The second nanowire or semiconductor body is isolated from the crystalline substrate by an isolation pedestal disposed between the second nanowire or semiconductor body and the crystalline substrate.

11 Claims, 18 Drawing Sheets

(51) Int. Cl.

| | | |
|---|---|---|
| H01L 29/775 | (2006.01) | |
| H01L 27/12 | (2006.01) | |
| B82Y 10/00 | (2011.01) | |
| B82Y 40/00 | (2011.01) | |
| H01L 29/06 | (2006.01) | |
| H01L 29/786 | (2006.01) | |
| H01L 21/8238 | (2006.01) | |
| H01L 27/092 | (2006.01) | |

(52) U.S. Cl.
CPC ...... *H01L 27/1211* (2013.01); *H01L 29/0649* (2013.01); *H01L 29/0673* (2013.01); *H01L 29/66439* (2013.01); *H01L 29/775* (2013.01); *H01L 29/78687* (2013.01); *H01L 29/78696* (2013.01); *H01L 21/823821* (2013.01); *H01L 27/0924* (2013.01)

(58) Field of Classification Search
CPC ........... H01L 29/78696; H01L 27/1211; H01L 27/0924
USPC .................................................. 257/9, 627
See application file for complete search history.

(56) References Cited

U.S. PATENT DOCUMENTS

| | | | |
|---|---|---|---|
| 2006/0097316 A1* | 5/2006 | Chen ................ H01L 21/76283 257/347 |
| 2007/0218628 A1* | 9/2007 | Orlowski .............. H01L 21/845 438/254 |
| 2008/0017934 A1* | 1/2008 | Kim .................... H01L 29/0657 257/401 |
| 2008/0135886 A1 | 6/2008 | Irisawa et al. |
| 2009/0072276 A1 | 3/2009 | Inaba |
| 2010/0044758 A1 | 2/2010 | Cohen et al. |
| 2010/0059807 A1* | 3/2010 | Cho ................. H01L 27/10814 257/306 |
| 2011/0012176 A1* | 1/2011 | Chidambarrao ....... B82Y 10/00 257/255 |
| 2011/0227165 A1 | 9/2011 | Basker et al. |
| 2016/0133735 A1* | 5/2016 | Cappellani ........ H01L 29/66439 257/19 |
| 2016/0336219 A1* | 11/2016 | Cappellani .......... H01L 27/1207 |

FOREIGN PATENT DOCUMENTS

| | | | | |
|---|---|---|---|---|
| CN | 101202288 | 6/2008 | | |
| JP | 2009054705 | 3/2009 | | |
| TW | 1283910 B | * | 7/2007 | ............ H01L 21/76 |
| TW | 201121040 | 6/2011 | | |
| TW | 201121040 A1 | * | 6/2011 | ............ H01L 29/40 |
| TW | I283910 | 7/2015 | | |

OTHER PUBLICATIONS

International Preliminary Report on Patentability from PCT/US2011/067242 mailed Jul. 3, 2014, 11 pgs.
Office Action and Search Report for Taiwan Patent Application No. 101147870, mailed Dec. 15, 2014, 19 pgs.(translation).
First Office Action for Chinese Patent Application No. 201180075728.5, dated Mar. 16, 2016, 13 pages.

* cited by examiner

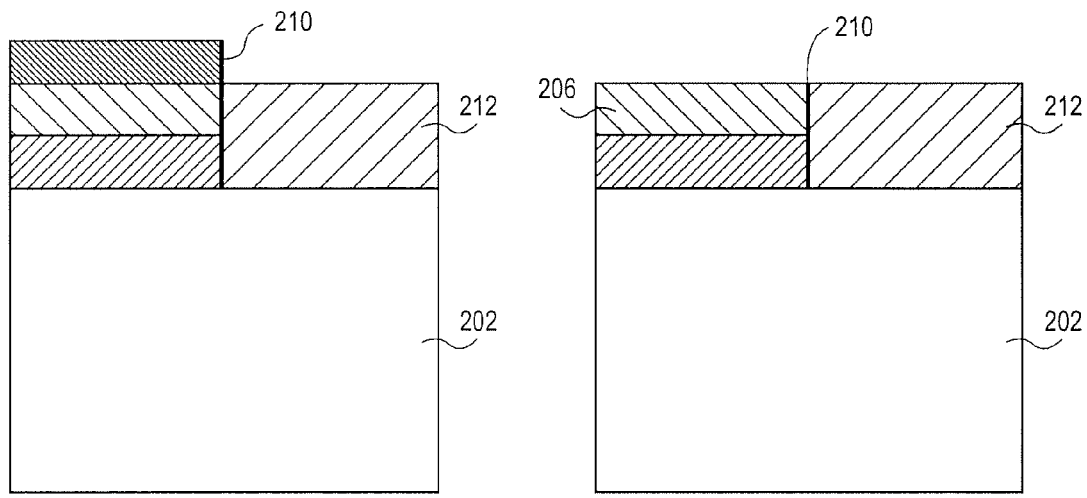
FIG. 2D    FIG. 2E
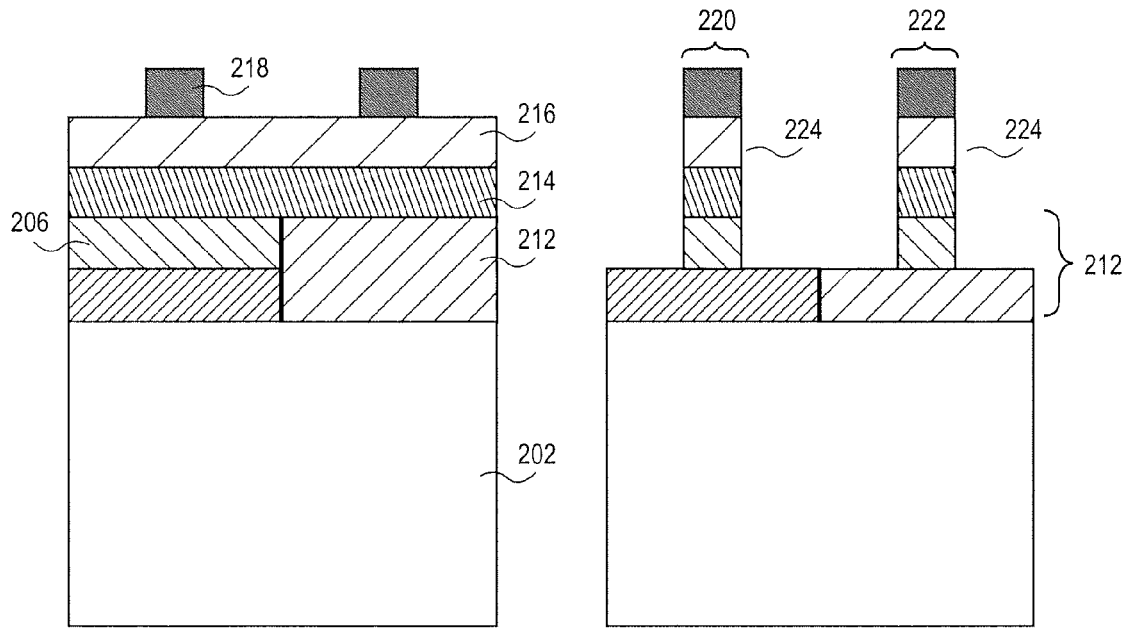
FIG. 2F    FIG. 2G

FIG. 2H  FIG. 2I

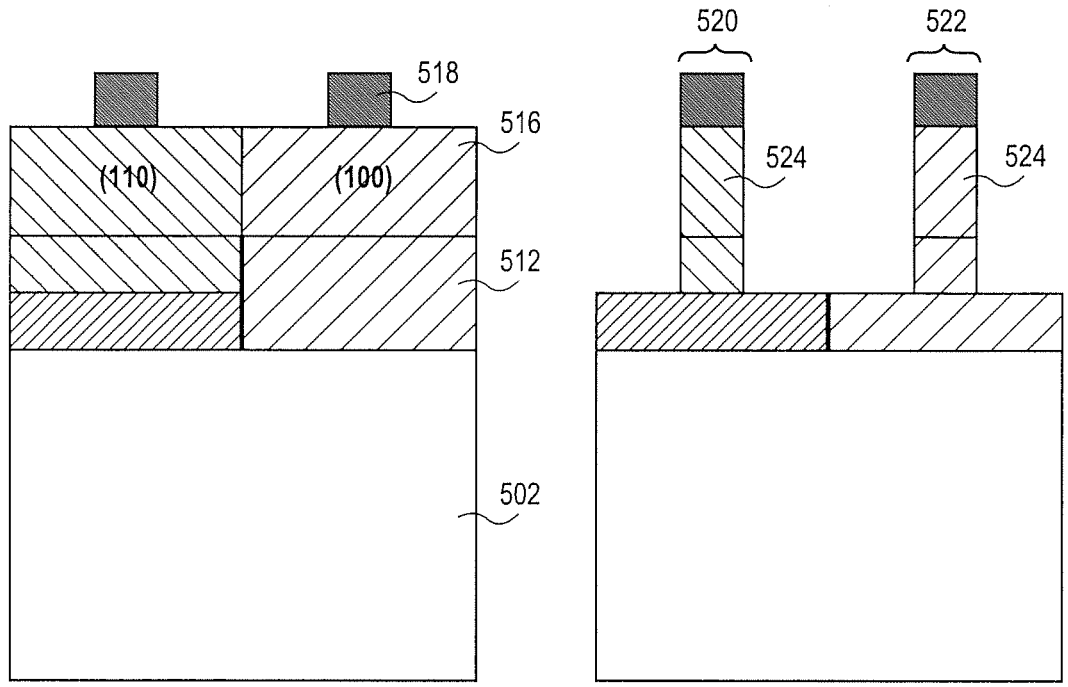
FIG. 5E
FIG. 5F
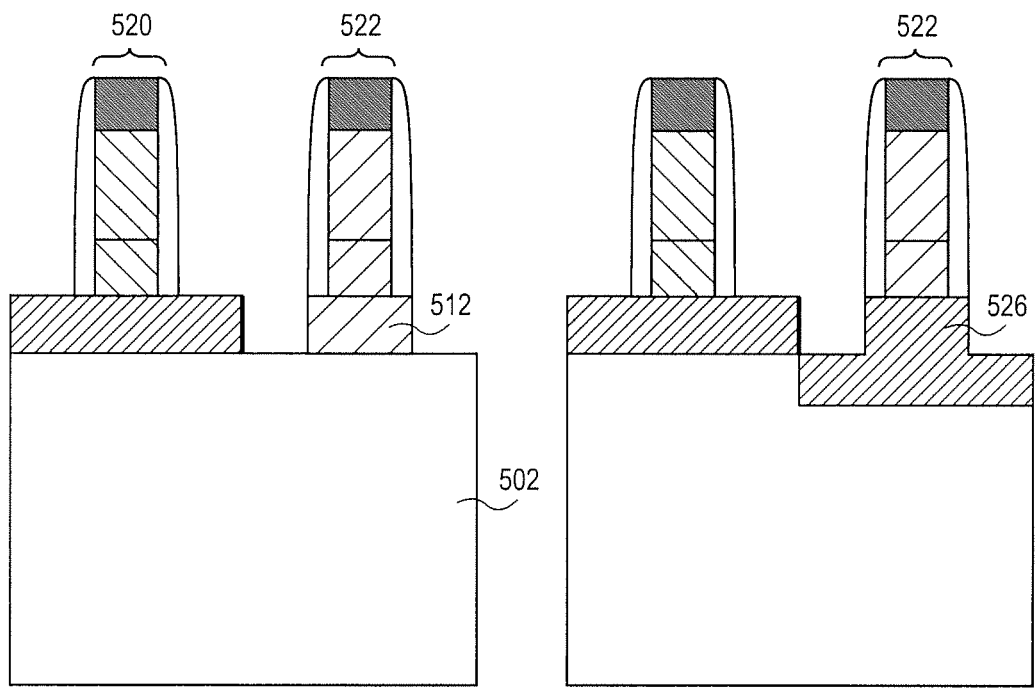
FIG. 5G
FIG. 5H

COMMON-SUBSTRATE SEMICONDUCTOR DEVICES HAVING NANOWIRES OR SEMICONDUCTOR BODIES WITH DIFFERING MATERIAL ORIENTATION OR COMPOSITION

CROSS-REFERENCE TO RELATED APPLICATIONS

This application is a continuation of U.S. patent application Ser. No. 13/996,506, filed on Jun. 20, 2013, which is a U.S. National Phase application under 35 U.S.C. §371 of International Application No. PCT/US2011/067242, filed Dec. 23, 2011, entitled "COMMON-SUBSTRATE SEMICONDUCTOR DEVICES HAVING NANOWIRES OR SEMICONDUCTOR BODIES WITH DIFFERING MATERIAL ORIENTATION OR COMPOSITION," the entire contents of which are incorporated herein by reference.

TECHNICAL FIELD

Embodiments of the invention are in the field of semiconductor devices and, in particular, common-substrate semiconductor devices having nanowires or semiconductor bodies with differing material orientation or composition and methods to form such common-substrate devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Maintaining mobility improvement and short channel control as microelectronic device dimensions scale past the 15 nanometer (nm) node provides a challenge in device fabrication. Nanowires used to fabricate devices provide improved short channel control. For example, silicon germanium ($Si_xGe_{1-x}$) nanowire channel structures (where x<0.5) provide mobility enhancement at respectable Eg, which is suitable for use in many conventional products which utilize higher voltage operation. Furthermore, silicon germanium ($Si_xGe_{1-x}$) nanowire channels (where x>0.5) provide mobility enhanced at lower Egs (suitable for low voltage products in the mobile/handheld domain, for example. Many different techniques have been attempted to fabricate and optimize nanowire-based devices. However, significant improvements are still needed in the area of nanowire devices.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

On bulk silicon substrates, the fabrication process for tri-gate transistors often encounters problems when aligning the bottom of the metal gate electrode with the source and drain extension tips at the bottom of the transistor body (i.e., the "fin"). When the tri-gate transistor is formed on a bulk substrate, proper alignment is needed for optimal gate control and to reduce short-channel effects. For instance, if the source and drain extension tips are deeper than the metal gate electrode, punch-through may occur. Alternately, if the metal gate electrode is deeper than the source and drain extension tips, the result may be an unwanted gate cap parasitics. Many different techniques have been attempted to fabricate and optimize three-dimensional devices. However, significant improvements are still needed in the area of three-dimensional semiconductor devices.

SUMMARY

Embodiments of the present invention include common-substrate semiconductor devices having nanowires or semiconductor bodies with differing material orientation or composition and methods to form such common-substrate devices.

In an embodiment, a semiconductor structure includes a first semiconductor device having a first nanowire disposed above a crystalline substrate. The first nanowire is composed of a semiconductor material having a first global crystal orientation. The semiconductor structure also includes a second semiconductor device having a second nanowire disposed above the crystalline substrate. The second nanowire is composed of a semiconductor material having a second global crystal orientation different from the first global orientation. The second nanowire is isolated from the crystalline substrate by an isolation pedestal disposed between the second nanowire and the crystalline substrate.

In another embodiment, a semiconductor structure includes a first semiconductor device having a first nanowire disposed above a crystalline substrate. The first nanowire is composed of a first semiconductor material. The semiconductor structure also includes a second semiconductor device having a second nanowire disposed above the crystalline substrate. The second nanowire is composed of a second semiconductor material different from the first semiconductor material. The second nanowire is isolated from the crystalline substrate by an isolation pedestal disposed between the second nanowire and the crystalline substrate.

In another embodiment, a semiconductor structure includes a first semiconductor device having a first semiconductor body disposed above a crystalline substrate. The first semiconductor body is composed of a semiconductor material having a first global crystal orientation. The semiconductor structure also includes a second semiconductor device having a second semiconductor body disposed above the crystalline substrate. The second semiconductor body is composed of a semiconductor material having a second global crystal orientation different from the first global orientation. The second semiconductor body is isolated from the crystalline substrate by an isolation pedestal disposed between the second semiconductor body and the crystalline substrate.

In another embodiment, a semiconductor structure includes a first semiconductor device having a first semiconductor body disposed above a crystalline substrate. The first semiconductor body is composed of a first semiconductor material. The semiconductor structure also includes a second semiconductor device having a second semiconductor body disposed above the crystalline substrate. The second semiconductor body is composed of a second semiconductor material different from the first semiconductor material. The second semiconductor body is isolated from the crystalline substrate by an isolation pedestal disposed between the second semiconductor body and the crystalline substrate.

BRIEF DESCRIPTION OF THE DRAWINGS

FIG. 1B' illustrates a cross-sectional view of another nanowire-based semiconductor device of FIG. 1A, as taken along the a-a' axis, in accordance with another embodiment of the present invention.

FIGS. 2A-2J illustrate cross-sectional views representing various operations in a method of fabricating a nanowire semiconductor structure, in accordance with an embodiment of the present invention.

FIG. 4B' illustrates a cross-sectional view of another semiconductor body-based semiconductor device of FIG. 4A, as taken along the a-a' axis, in accordance with another embodiment of the present invention.

FIGS. 5A-5I illustrate cross-sectional views representing various operations in a method of fabricating a semiconductor body-based semiconductor structure, in accordance with an embodiment of the present invention.

DETAILED DESCRIPTION

Common-substrate semiconductor devices having nanowires or semiconductor bodies with differing material orientation or composition and methods to form such common-substrate devices are described. In the following description, numerous specific details are set forth, such as specific nanowire or semiconductor body integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are targeted at transistor fabrication having different active regions (also described as different substrates) on the same production wafer. For example, in one embodiment, an under fin oxidation (UFO) technique is used to integrate fins or wires on different substrates on the same wafer. The process flows described herein may be applicable to tri-gate and fin-FET transistors, e.g., for the 14 nanometer node and beyond. Embodiments may include processing a silicon-on-insulator (SOI) wafer with different substrates separated by a buried oxide (BOX) layer. Using a UFO approach, the integration of transistors on different substrates, one next to another, may be achieved. Improve performance for transistors may be achieved by reducing standby leakage which may be especially critical to 14 nanometer node system on a chip (SOC) products with extremely stringent standby power requirements.

Current semiconductor processing often requires p-MOS and n-MOS devices be fabricated from the same starting material and crystal orientation. Instead, in accordance with an embodiment of the present invention, the most suitable transistor properties of different channel materials and/or orientations for each polarity of device may be used on the same wafer. Additionally, building fin-FETs or tri-gate devices on fins with a buried oxide layer or an isolation pedestal may be used to isolate the active fin channel from the underlying substrates. Thus, the integration of different substrates on the same wafer for fins and wire processes is described below. For example, in one embodiment, one type of substrate, e.g., (100) Si or III-V on (111), for nMOS, and another type, e.g., (110) Si, for PMOS are fabricated on the same wafer.

Figure 1A:
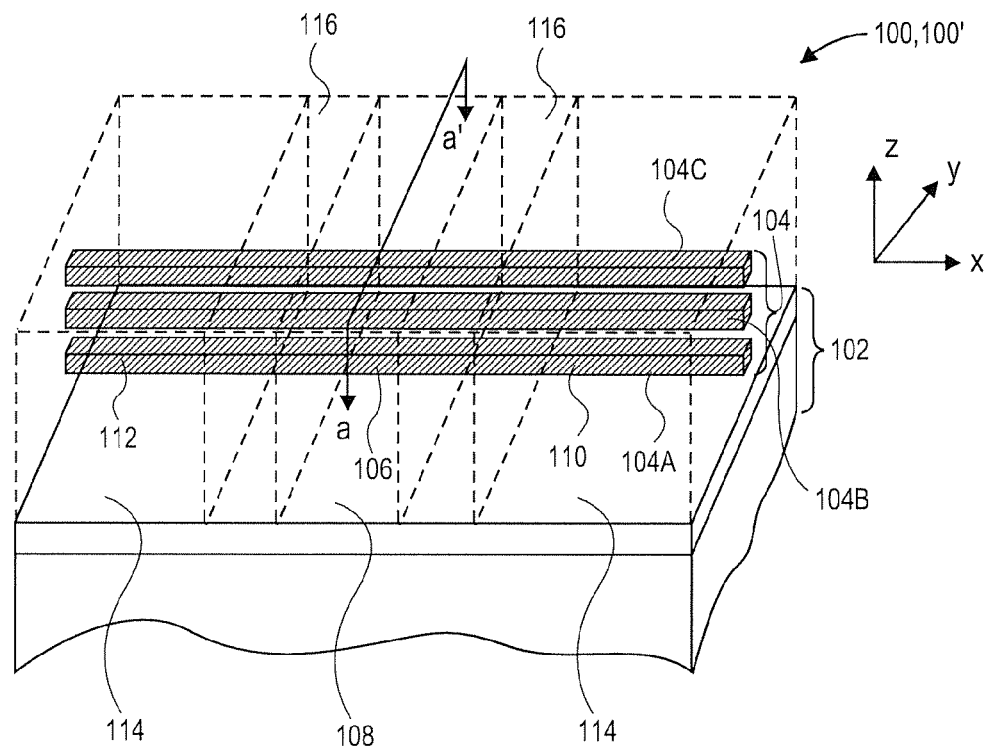
FIG. 1A illustrates a three-dimensional cross-sectional view of nanowire-based semiconductor devices, in accordance with an embodiment of the present invention.
Figure 1B:
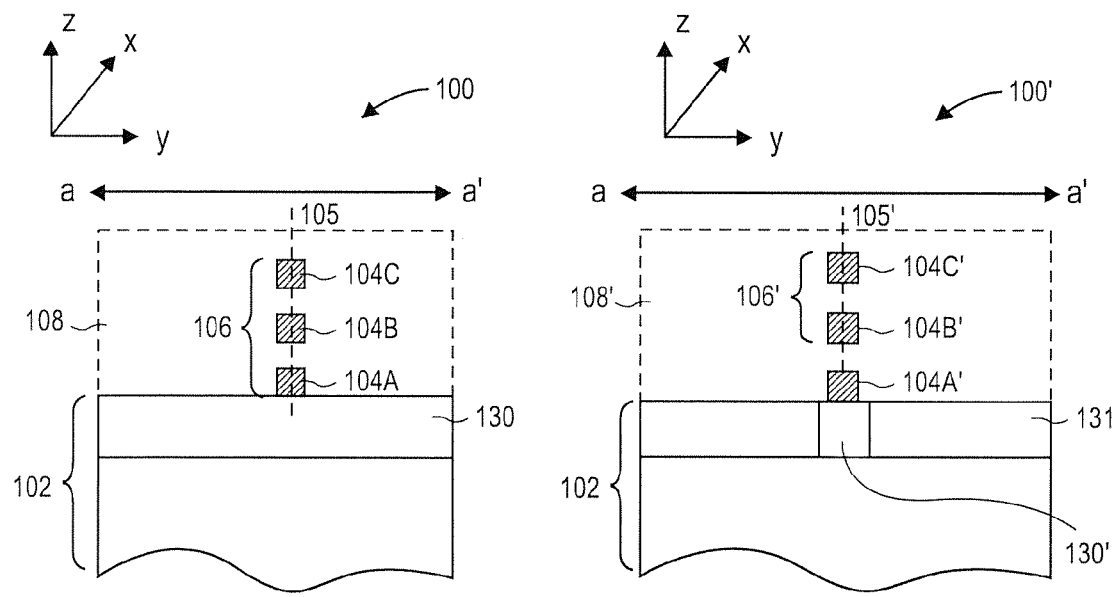
FIG. 1B illustrates a cross-sectional view of a nanowire-based semiconductor device of FIG. 1A, as taken along the a-a' axis, in accordance with an embodiment of the present invention.

Thus, in a first aspect, devices with nanowire crystal orientation or material composition modulation on a common substrate are provided by approaches described herein. In an example, FIG. 1A illustrates a three-dimensional cross-sectional view of nanowire-based semiconductor devices 100 and 100', in accordance with an embodiment of the present invention. FIG. 1B illustrates a cross-sectional view of the nanowire-based semiconductor device 100 of FIG. 1A, as taken along the a-a' axis. FIG. 1B' illustrates a cross-sectional view of the nanowire-based semiconductor device 100' of FIG. 1A, as taken along the a-a' axis.

Referring to FIG. 1A, a semiconductor device 100 or 100' includes one or more vertically stacked nanowires (104 set) disposed above a crystalline substrate 102. Embodiments herein are targeted at both multiple wire devices and single wire devices. As an example, a three nanowire-based device 100 (or 100') having nanowires 104A, 104B and 104C is shown. For convenience of description, nanowire 104A is used as an example where description is focused on only one of the nanowires. It is to be understood that where attributes of one nanowire are described, embodiments based on a plurality of nanowires may have the same attributes for each of the nanowires.

In an embodiment, a common crystalline substrate 102 has disposed thereon devices with differing global crystal orientation and/or material composition. For example, semiconductor device 100 and 100' may be included on the same substrate 102. The devices are elaborated in FIGS. 1B and 1B'. It is to be understood that embodiments herein may contemplate any differing global crystal orientation and/or material composition between devices.

Referring to FIG. 1B, a semiconductor structure including both devices 100 and 100' from FIG. 1A includes a first semiconductor device 100 having a plurality of nanowires (three: 104A, 104B, and 104C) disposed above the substrate 102 and stacked in a first vertical plane 105 with an uppermost nanowire 104C and a lowermost nanowire 104A. Referring to FIG. 1B', a second semiconductor device 100' has one or more nanowires (three: 104A', 104B' and 104C') disposed above the substrate 102 and stacked in a second vertical plane 105' with an uppermost nanowire 104C' and a lowermost nanowire 104A'. In an embodiment, as depicted, the first and second uppermost nanowires 104C and 104C', respectively, are disposed in a same plane as one another, orthogonal to the first and second vertical planes 105 and 105'. That is, the nanowires 104C and 104C' are equally spaced above the common substrate 102.

As depicted in FIGS. 1A, 1B and 1B', in an embodiment, each of the nanowires has a discrete channel region 106. The channel region 106 is discrete in that it is completely surrounded by the gate electrode stack 108 (described below) without any intervening material such as underlying substrate material or overlying channel fabrication materials. Accordingly, in embodiments having a plurality of nanowires 104, the channel regions 106 of the nanowires are also discrete relative to one another, as depicted in FIGS. 1B and 1B'. In one such embodiment, each of the nanowires also includes a pair of discrete source and drain regions 110 and 112, as down in FIG. 1A. That is, the source/drain regions 110/112 are completely surrounded by the contacts 114 (described below) without any intervening material such as underlying substrate material or overlying channel fabrication materials. Accordingly, in such an embodiment having a plurality of nanowires 104, the source/drain regions 110/112 of the nanowires are also discrete relative to one another. In an alternative such embodiment (not shown), however, the stacks of nanowires include a pair of non-discrete source and drain regions.

In accordance with an embodiment of the present invention, nanowire 104A is composed of a semiconductor material having a first global crystal orientation. Meanwhile, nanowire 104A' is composed of a semiconductor material having a second global crystal orientation different from the first global orientation. In both cases, global orientation is defined along the Z-direction, e.g., in the same direction as vertical planes 105 and 105', respectively. In accordance with another embodiment of the present invention, nanowire 104A is composed of a first semiconductor material. Meanwhile, nanowire 104A' is composed of a second semiconductor material different from the first semiconductor material. In accordance with yet another embodiment of the present invention, nanowire 104A is composed of a first semiconductor material and has a first global crystal orientation. Meanwhile, nanowire 104A' is composed of a second semiconductor material different from the first semiconductor material and has a second global crystal orientation different from the first global orientation.

In an embodiment, the nanowire 104A' of the semiconductor device 100' is isolated from the crystalline substrate 102 by an isolation pedestal 130' disposed between the nanowire and the crystalline substrate, as depicted in FIG. 1B'. In an embodiment, the nanowire 104A of the semiconductor device 100 is isolated from the crystalline substrate 102 by a buried dielectric layer 130 disposed between the nanowire 104A and the crystalline substrate 102, as depicted in FIG. 1B. In an embodiment, the composition of the buried dielectric layer 130 is essentially the same as the composition of the isolation pedestal 130', e.g., both are composed of silicon dioxide. In another embodiment, however, the composition of the buried dielectric layer 130 is different from the composition of the isolation pedestal 130', e.g., the isolation pedestal 130' is composed of silicon dioxide, while the buried oxide layer 130 is composed of silicon nitride or silicon oxynitride. A further isolation portion 131, shown in FIG. 1B', may be included and may be composed of a dielectric material such as, but not limited to, silicon nitride, silicon oxide or silicon oxynitride.

The intervening dielectric portions 130, 130', or 131 may be an artifact of the fabrication process used to provide devices 100 and 100' on a common substrate. It is to be understood that although possibly present during partial fabrication, any of the intervening dielectric portions 130, 130', or 131 may be removed prior to completion of a semiconductor device. Formation of such intervening dielectric portions 130, 130', or 131 is described in greater detail below.

In an embodiment, the term "isolation pedestal" is used to covey a discrete isolation structure formed at a given time, e.g., a discrete structure formed only under a channel region, or a pair of discrete structures formed only under a pair of source and drain regions, or a discrete structure formed under a channel region as well as under a pair of source and drain regions. In another embodiment, the term "isolation pedestal" is used to covey a combination of isolation structures formed at different times, e.g., a discrete structure formed under a channel region in combination with a pair of discrete structures formed, at a different time, under a pair of source and drain regions.

In an embodiment, the crystalline substrate 102 has a global orientation the same as the second global orientation, e.g., the same as the global orientation of nanowire 104A' of FIG. 1B'. In one such embodiment, the crystalline substrate 102 and the semiconductor material of the nanowire 104A' are composed of a Group IV material with a (100) global orientation, while the semiconductor material of the nanowire 104A of device 100 is composed of a Group IV material with a (110) global orientation. The Group IV materials may include silicon, silicon germanium, or germanium. In another embodiment, the semiconductor material of the nanowire 104A' is a Group IV material, and the semiconductor material of the nanowire 104A is a Group IV material or a Group III-V material.

In an embodiment (not shown), a semiconductor structure including devices 100 and 100' further includes a third semiconductor device having a third nanowire disposed above the crystalline substrate 102. The third nanowire is composed of a semiconductor material having a third global crystal orientation different from the first and second global orientations. The third nanowire is isolated from the crystalline substrate 102 by a second isolation pedestal disposed between the third nanowire and the crystalline substrate 102.

In another embodiment (not shown), a semiconductor structure including devices 100 and 100' further includes a third semiconductor device having a third nanowire disposed above the crystalline substrate 102. The third nanowire is composed of a third semiconductor material different from the first and second semiconductor materials. The third nanowire is isolated from the crystalline substrate 102 by a second isolation pedestal disposed between the third nanowire and the crystalline substrate 102. More general embodiments follow below.

Substrate 102 may be composed of a material suitable for semiconductor device fabrication. In one embodiment, substrate 102 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxy-nitride is disposed on the lower bulk substrate. Thus, the structure 100 may be fabricated from a starting semiconductor-on-insulator substrate or may be formed to have such an insulating layer during fabrication of the nanowires, as described in greater detail below.

Alternatively, the structure 100 is formed, at least in part, directly from a bulk substrate and local oxidation is used to form electrically insulative portions in place of the above described upper insulator layer. In another alternative embodiment, the structure 100 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 104 may be sized as wires or ribbons, and may have squared-off or rounder corners. In an embodiment, the nanowires 104 are composed of a material such as, but not limited to, silicon, germanium, or a combination thereof. In one such embodiment, the nanowires are single-crystalline. For example, for a silicon nanowire 104, a single-crystalline nanowire may be based from a (100) global orientation, e.g., with a <100> plane in the z-direction. In an embodiment, the dimensions of the nanowires 104, from a cross-sectional perspective, are on the nano-scale. For example, in a specific embodiment, the smallest dimension of the nanowires 104 is less than approximately 20 nanometers. In an embodiment, the nanowires 104 are composed of a strained material, particularly in the channel regions 106. The width and height of each of the channel regions 106 is shown as approximately the same in FIGS. 1B and 1B', however, they need not be. For example, in another embodiment (not shown), the width of the nanowires 104 is substantially greater than the height. In a specific embodiment, the width is approximately 2-10 times greater than the height. Nanowires with such geometry may be referred to as nanoribbons. In an alternative embodiment (also not shown), the nanoribbons are oriented vertically. That is, each of the nanowires 104 has a width and a height, the width substantially less than the height.

Referring to FIGS. 1A, 1B and 1B', in an embodiment, the semiconductor devices 100 or 100' further include respective gate electrode stacks 108 or 108' surrounding a portion of each of the plurality of nanowires of the device. In one such embodiment, the gate electrode stacks 108 or 108' each include a gate dielectric layer and a gate electrode layer (not shown). In an embodiment, the gate electrode of gate electrode stack 108 or 108' is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the nanowire 104. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Referring again to FIG. 1A, in an embodiment, the semiconductor devices 100 or 100' further first and second contacts 114 surrounding respective portions of each of the plurality of nanowires 104. The contacts 114 are, in an embodiment, fabricated from a metal species. The metal species may be a pure metal, such as nickel or cobalt, or may be an alloy such as a metal-metal alloy or a metal-semiconductor alloy (e.g., such as a silicide material).

In an embodiment, the semiconductor devices 100 or 100' further include first and second spacers 116 disposed between the gate electrode stack 108 and the first and second contacts 114, respectively, as depicted in FIG. 1A. As described above, the channel regions and the source/drain regions of the nanowires 104 are, in at least several embodiments, made to be discrete. However, not all regions of the nanowires 104 need be, or even can be made to be discrete. For example, nanowires 104A-104C may not be discrete at the location under spacers 116. In one embodiment, the stack of nanowires 104A-104C have intervening semiconductor material there between, such as silicon germanium intervening between silicon nanowires, or vice versa. Thus, in an embodiment, a portion of the plurality of vertically stacked nanowires under one or both of the spacers is non-discrete. In an embodiment, the spacers 116 are composed of an insulative dielectric material such as, but not limited to, silicon dioxide, silicon oxy-nitride or silicon nitride.

Although the device 100 or 100' described above is for a single device, e.g., an NMOS or a PMOS device, a CMOS architecture may also be formed to include both NMOS and PMOS nanowire-based channel devices disposed on or above the same substrate. In an embodiment, referring to FIGS. 1B and 1B', the first and second vertical planes 105 and 105', respectively, are parallel to one another.

As an example of an approach to forming devices, such as devices 100 and 100', on a common substrate, FIGS. 2A-2J illustrate cross-sectional views representing various operations in a method of fabricating a nanowire semiconductor structure, in accordance with an embodiment of the present invention.

Figure 2A:
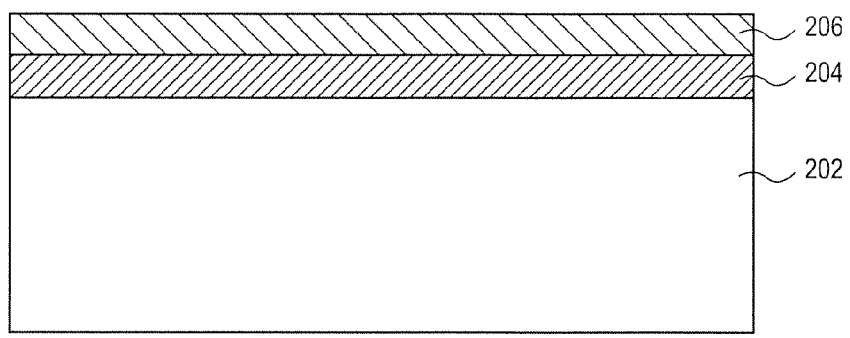

Referring to FIG. 2A, a process begins with two active layers (may be referred to as two substrates), namely a crystalline substrate 202 and a crystalline active layer 206, separated by a dielectric layer 204. In an embodiment, the substrate 202 is a (100) silicon substrate, the crystalline active layer is a (110) silicon layer, e.g. approximately 10 nanometers thick, and the dielectric layer 204 is a thin silicon dioxide ($SiO_2$) buried oxide layer (BOX layer). It is to be understood that variable BOX and/or top silicon layer thicknesses may be used as needed. Also, different types of orientation in the substrate and in the top silicon layer may be used. Substrates and layers may be strained or not strained. Materials may instead be silicon germanium (SiGe), germanium (Ge) or a III-V or other material. Substrates and layers may be doped (e.g., carbon-doped silicon, or P-doped silicon, or B-doped silicon, or may not be doped.

Figure 2B:
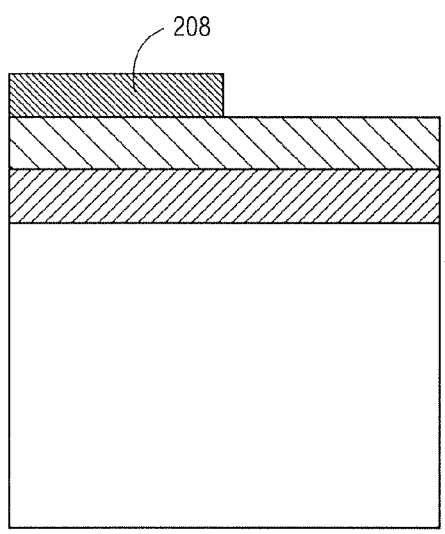
Figure 2C:
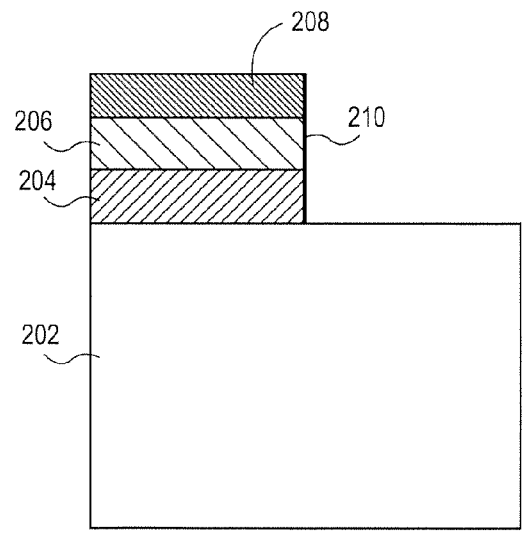

Referring to FIG. 2B, a mask layer 208 is formed on one side of the structure of FIG. 2A. The exposed portion is then etched etch down below the dielectric layer 204. A spacer 210 is then formed, e.g., by depositing a dielectric layer and etching it, as depicted in FIG. 2C. Referring to FIG. 2D, epitaxial growth of a seed layer 212, e.g., a silicon seed layer 212, is performed on the exposed portions of substrate 202. Alternatively, a silicon germanium and silicon layer may be formed on top of the (100) silicon, followed by stripping of the mask layer 208.

Referring to FIG. 2E, the mask layer 208 is removed and the spacer 210 is recessed. Alternatively, thicker epitaxial layer may be formed and planarized to expose the active layer 206. Alternatively, the spacer may be reformed on a SiGe/Si sidewall and then, by masking the (100) side, a SiGe/Si stack may be formed on the (110) side and then planarized or the mask layer 208 removed. Referring to FIG. 2F, a stack composed of a silicon germanium layer 214 and a silicon layer 216 is epitaxilly grown as seeding from the substrate 202. The silicon germanium layer 214 and the silicon layer 216 both have a (100) portion and a (110) portion with, potentially a defective zone grown at the respective (100) and (110) boundaries. The defective zones may be etched out during subsequent fin etch.

Figure 2J:
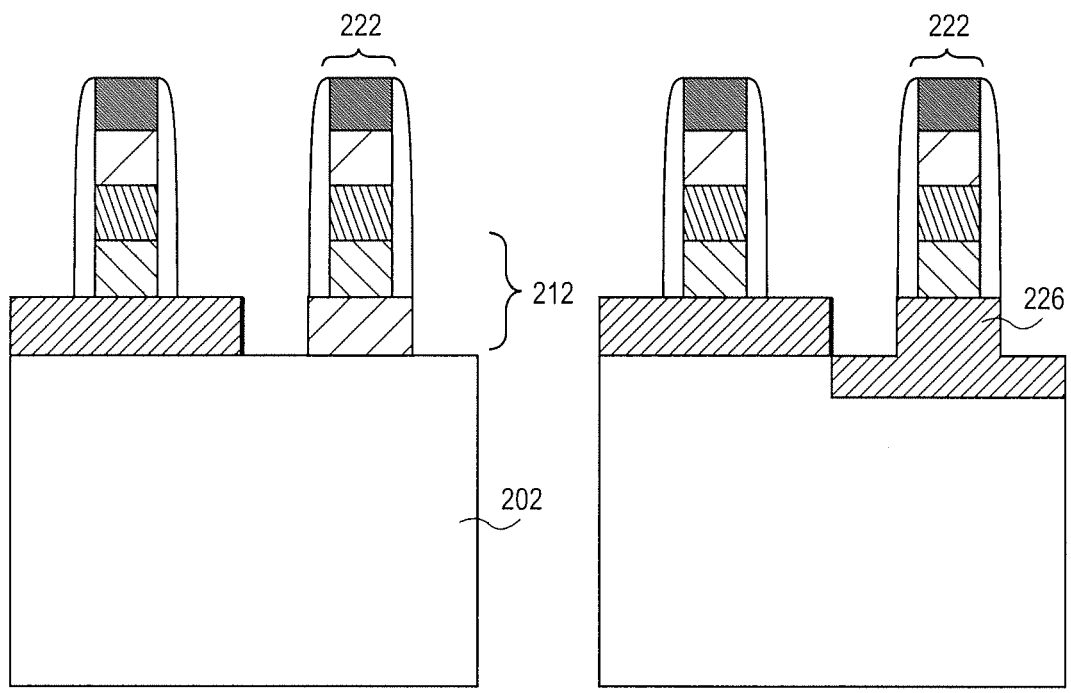
Figure 2J:
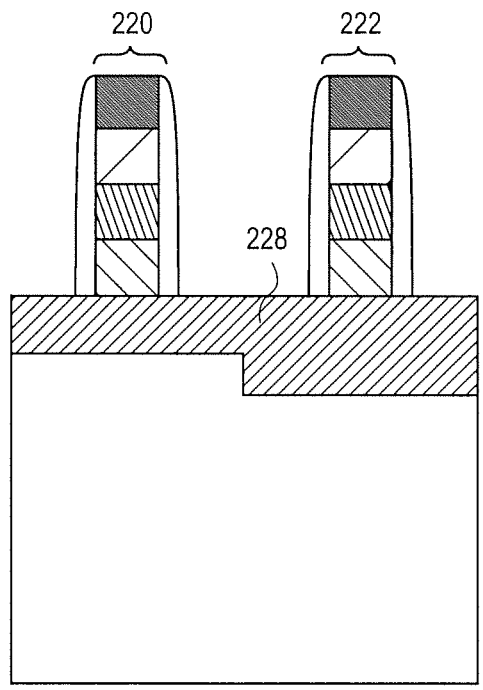

Referring to FIG. 2G, fins 220 and 222 are formed by etching using masking layer 218 formed in association with FIG. 2F. Also, spacers 224 are formed on the sidewalls of fins 220 and 222. Then, the fin 222 is etched down further to reveal substrate 202, as depicted in FIG. 2H. Referring to FIG. 2I, an under fin oxidation (UFO) process is performed to form an isolation pedestal 226 under fin 222. An additional dielectric portion 228 may be formed by deposition and planarzation (e.g., by etching) and spacers 224 and mask layer 218 may be removed, as depicted in FIG. 2J.

Referring again to FIG. 2I, in an embodiment, the exposed portions of layer 212 along with a top portion of substrate 202 are oxidized to form the isolation pedestal 226 by "under fin oxidation" (UFO). In an embodiment, the use of spacers may be required if a same or like material is being oxidized, and may even be included if non-like materials are used. In an embodiment, an oxidizing atmosphere or an adjacent oxidizing material may be used for UFO. However, in another embodiment, oxygen implant is used. In some embodiments, a portion of a material is recessed prior to UFO which may reduce the extent of so-called birds-beak formation during oxidation. Thus, the oxidation may be performed directly, by recessing first, or by oxygen implant, or a combination thereof.

First and second semiconductor devices may then be formed from the first and second fins 220 and 222, respectively. In an embodiment, forming the first semiconductor device includes forming a plurality of nanowires having discrete portions, and forming the second semiconductor device includes forming one or more nanowires also having discrete portions. The wires may be made discrete by having gate placeholders in place or by having source and drain regions strapped down, or both at different processing stages, and then removing the silicon germanium layer. In an embodiment, a PMOS device is formed from the (110) silicon fin 220, while an NMOS device is formed from the (100) silicon fin 222.

As an example of another approach to forming devices, such as devices 100 and 100', on a common substrate, FIGS. 3A-3K illustrate cross-sectional views representing various operations in a method of fabricating another nanowire semiconductor structure, in accordance with another embodiment of the present invention.

Figure 3A:
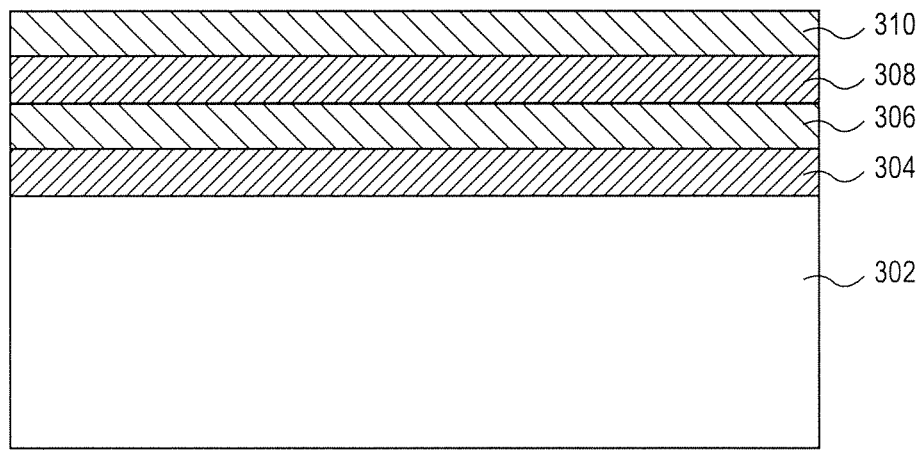
FIGS. 3A-3K illustrate cross-sectional views representing various operations in a method of fabricating another nanowire semiconductor structure, in accordance with another embodiment of the present invention.

Referring to FIG. 3A, a process begins with three active layers (may be referred to as three substrates), namely a crystalline substrate 302, a first crystalline active layer 306, and a second crystalline active layer 310, each separated by a dielectric layer 304 or 308. In an embodiment, the substrate 302 is a (100) silicon substrate, the first crystalline active layer is a (110) silicon layer, e.g. approximately 10 nanometers thick, the second crystalline active layer is a (111) silicon layer, e.g. approximately 10 nanometers thick, and the dielectric layers 304 and 308 are thin silicon dioxide (SiO$_2$) buried oxide layers (BOX layers). It is to be understood that variable BOX and/or top silicon layer thicknesses may be used as needed. Also, different types of orientation in the substrate and in the top silicon layer may be used. Substrates and layers may be strained or not strained. Materials may instead be silicon germanium (SiGe), germanium (Ge) or a III-V or other material. Substrates and layers may be doped (e.g., carbon-doped silicon, or P-doped silicon, or B-doped silicon, or may not be doped.

Figure 3B:
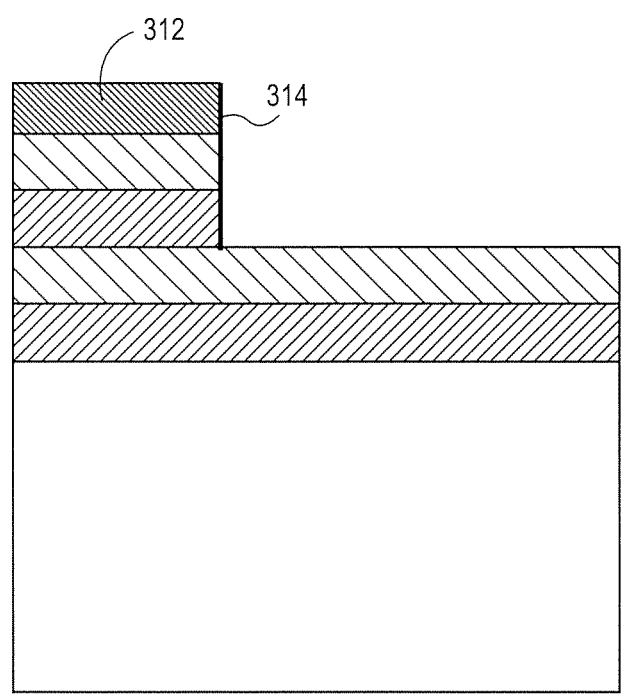
Figure 3C:
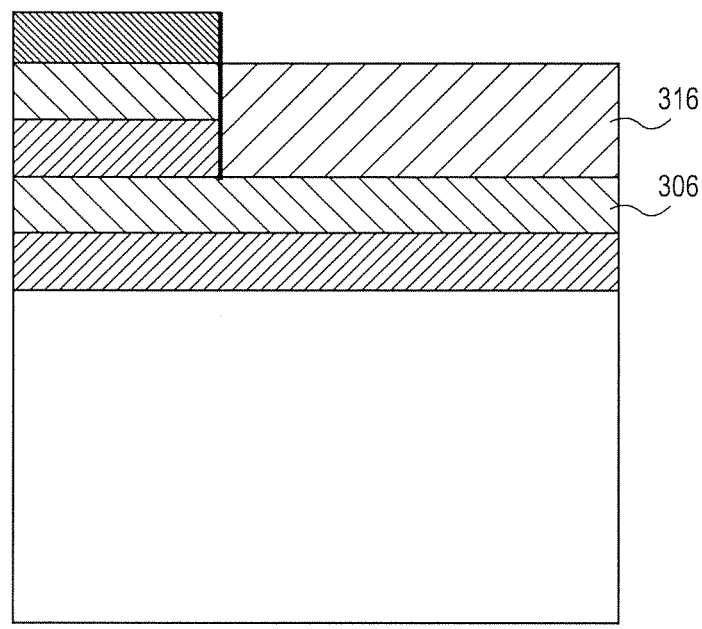
Figure 3D:
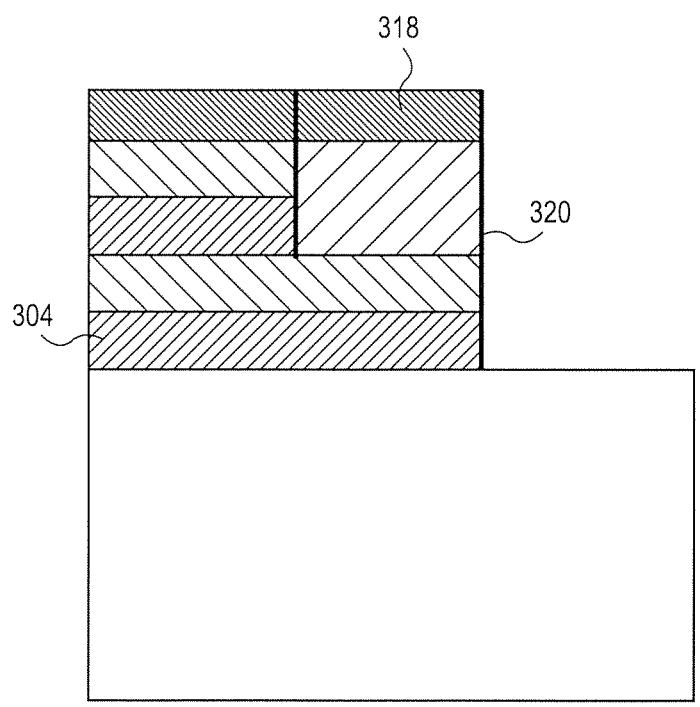
Figure 3E:
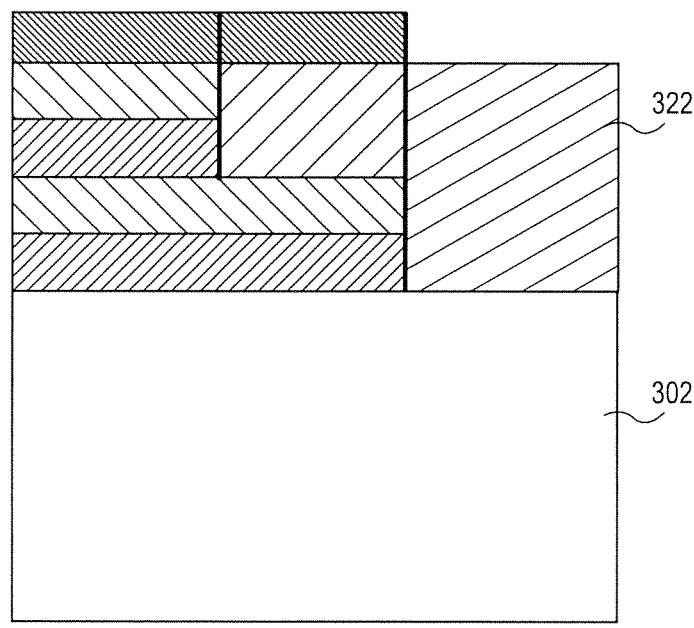

Referring to FIG. 3B, a mask layer 312 is formed on one side of the structure of FIG. 3A. The exposed portion is then etched etch down below the dielectric layer 308. A spacer 314 is then formed, e.g., by depositing a dielectric layer and etching it. Epitaxial growth of a seed layer 316, e.g., a silicon seed layer 316, is performed on the exposed portions of first crystalline active layer 306, as depicted in FIG. 3C. Referring to FIG. 3D, a second mask layer 318 is formed. The exposed portion is then etched etch down below the dielectric layer 304. A spacer 320 is then formed, e.g., by depositing a dielectric layer and etching it. Epitaxial growth of a seed layer 322, e.g., a silicon seed layer 322, is performed on the exposed portions of the substrate 302, as depicted in FIG. 3E.

Figure 3F:
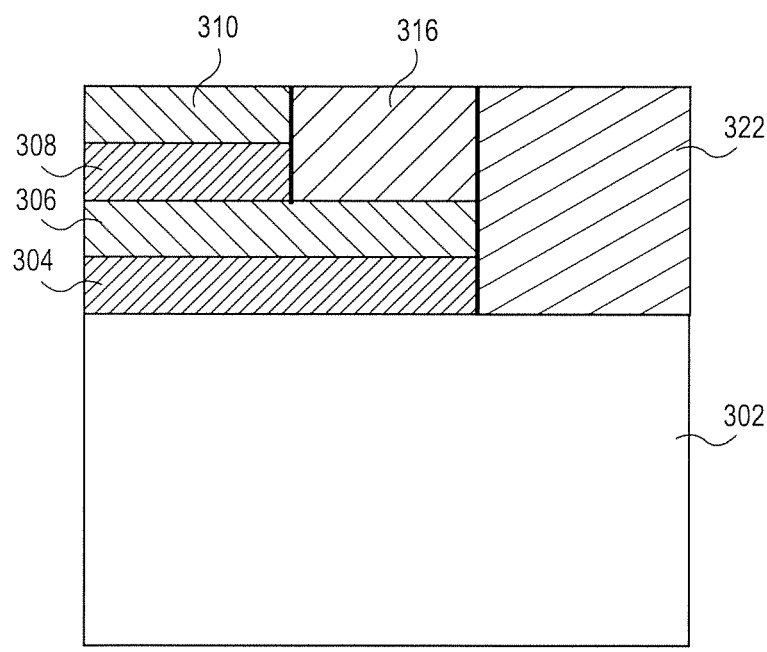
Figure 3G:
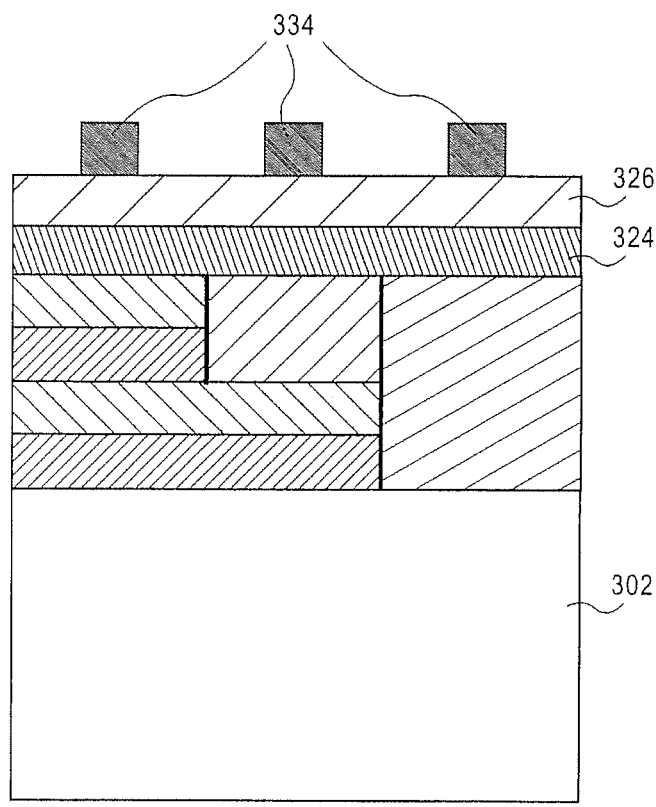

Referring to FIG. 3F, the mask layers 312 and 318 are removed and the spacers 320 and 314 are recessed. Referring to FIG. 3G, a stack composed of a silicon germanium layer 324 and a silicon layer 326 is epitaxilly grown as seeding from the substrate 302. The silicon germanium layer 324 and the silicon layer 326 both have a (100) portion, a (110) portion, and a (111) portion with, potentially a defective zone grown at the respective (100) and (110) boundaries and at the respective (110) and (111) boundaries. The defective zones may be etched out during subsequent fin etch.

Figure 3H:
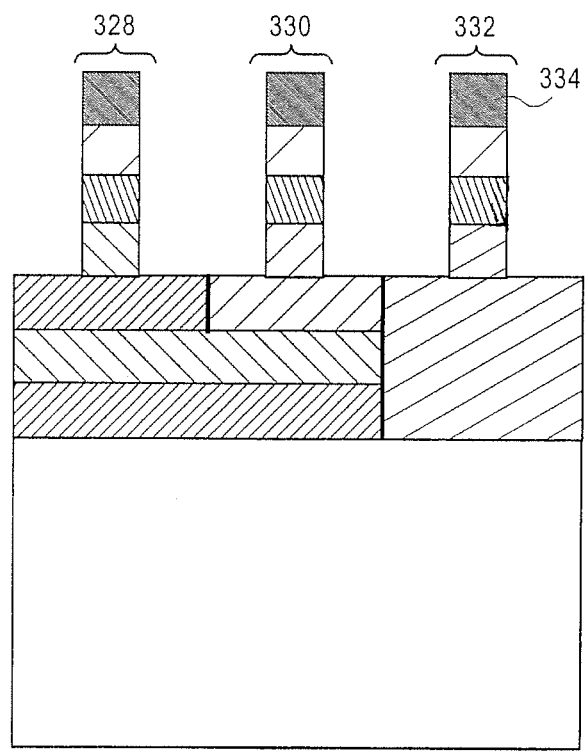
Figure 3I:
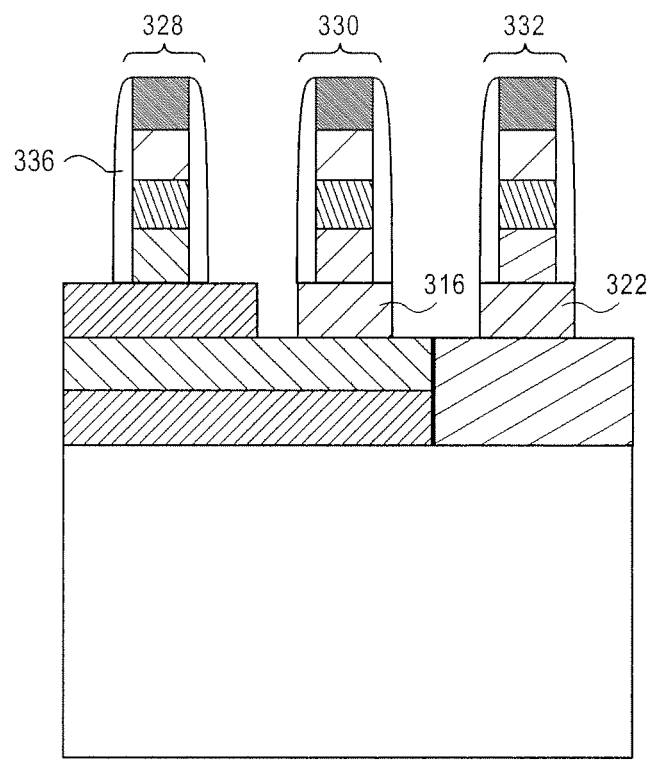
Figure 3J:
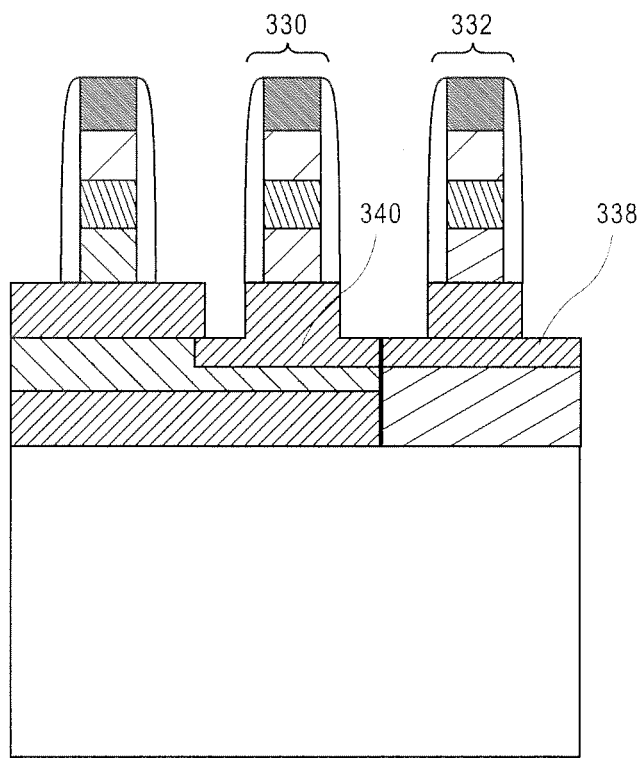
Figure 3K:
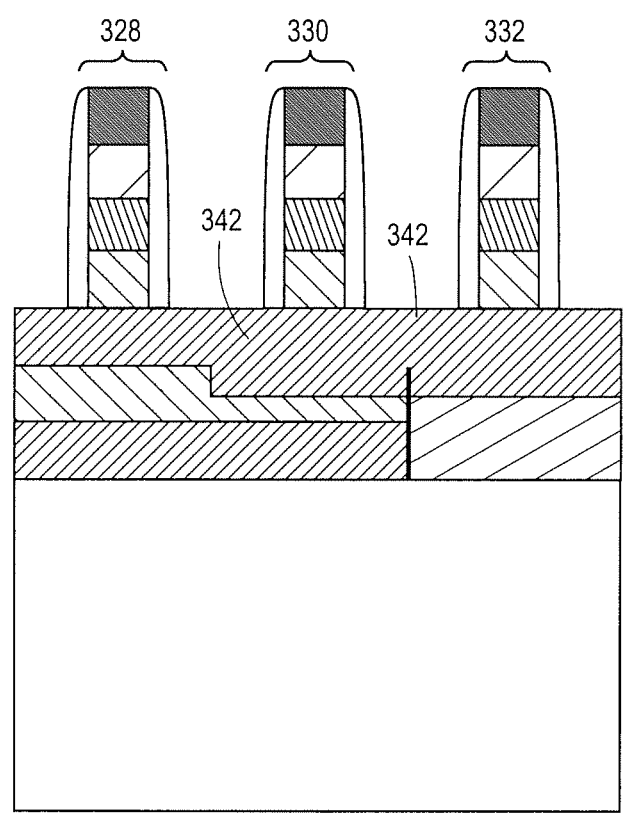

Referring to FIG. 3H, fins 328, 330, and 332 are formed by etching using masking layer 334 formed in association with FIG. 3G. Also, spacers 336 are formed on the sidewalls of fins 328, 330, and 332. Then, the fins 330 and 332 are etched down further to reveal respective portions of layers 316 and 322, as depicted in FIG. 3I. Referring to FIG. 3J, an under fin oxidation (UFO) process is performed to form isolation pedestal 338 under fin 332 and isolation pedestal 340 under fin 330. An additional dielectric portion 342 may be formed by deposition and planarzation (e.g., by etching) and spacers 336 and mask layer 334 may be removed, as depicted in FIG. 3K. First, second and third semiconductor devices may then be formed from the first, second and third fins 328, 330, and 332, respectively.

Figure 4A:
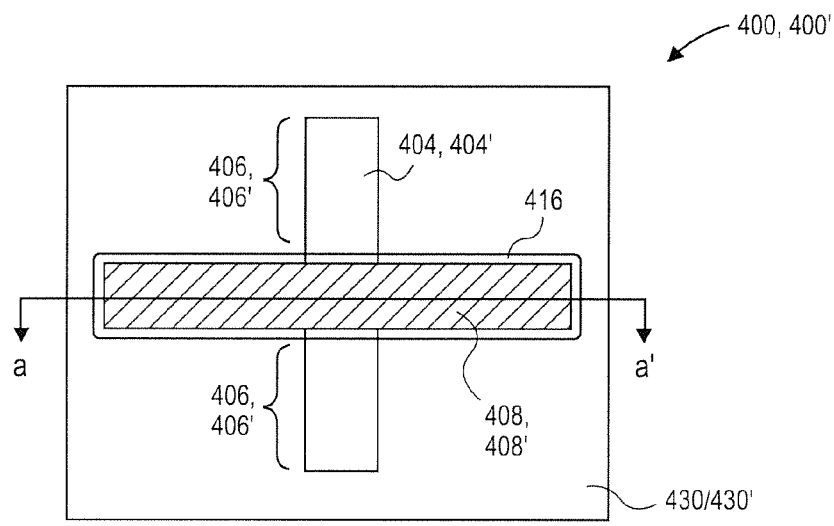
FIG. 4A illustrates a three-dimensional cross-sectional view of semiconductor body-based semiconductor devices, in accordance with an embodiment of the present invention.
Figure 4B:
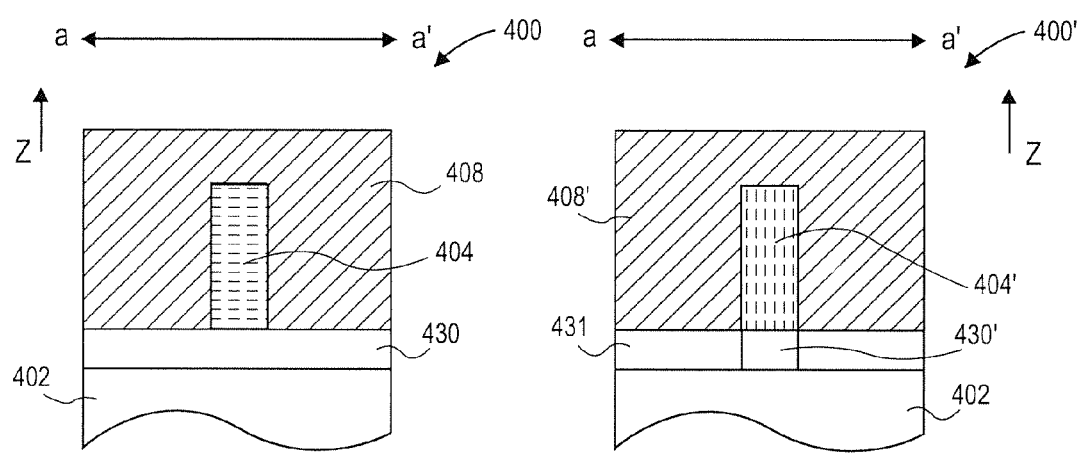
FIG. 4B illustrates a cross-sectional view of a semiconductor body-based semiconductor device of FIG. 4A, as taken along the a-a' axis, in accordance with an embodiment of the present invention.

In another aspect, devices with semiconductor body crystal orientation or material composition modulation on a common substrate are provided by approaches described herein. For example, FIG. 4A illustrates a three-dimensional cross-sectional view of semiconductor body-based semiconductor devices, in accordance with an embodiment of the present invention. FIG. 4B illustrates a cross-sectional view of a semiconductor body-based semiconductor device of FIG. 4A, as taken along the a-a' axis, in accordance with an embodiment of the present invention. FIG. 4B' illustrates a cross-sectional view of another semiconductor body-based semiconductor device of FIG. 4A, as taken along the a-a' axis, in accordance with another embodiment of the present invention.

Referring to FIG. 4A, a semiconductor device 400 or 400' includes a semiconductor body 404 or 404' disposed above a crystalline substrate 402. Embodiments herein are targeted at both multiple wire devices and single wire devices. In an embodiment, a common crystalline substrate 402 has disposed thereon devices with differing global crystal orientation and/or material composition.

For example, semiconductor device 400 and 400' may be included on the same substrate 402. The devices are elaborated in FIGS. 4B and 4B'. It is to be understood that embodiments herein may contemplate any differing global crystal orientation and/or material composition between devices. Referring to FIG. 4B, a semiconductor structure including both devices 400 and 400' from FIG. 4A includes a first semiconductor device 400 having a semiconductor body 404 disposed above the substrate 402. Referring to FIG. 4B', a second semiconductor device 400' has a semiconductor body 404' disposed above the substrate 402. The semiconductor bodies 404 and 404' include source and drain portions 406 and 406', respectively, as well as channel portions.

In accordance with an embodiment of the present invention, semiconductor body 404 is composed of a semiconductor material having a first global crystal orientation. Meanwhile, semiconductor body 404' is composed of a semiconductor material having a second global crystal orientation different from the first global orientation. In both cases, global orientation is defined along the Z-direction, as depicted in FIGS. 4A and 4B'. In accordance with another embodiment of the present invention, semiconductor body 404 is composed of a first semiconductor material. Meanwhile, semiconductor body 404' is composed of a second semiconductor material different from the first semiconductor material. In accordance with yet another embodiment of the present invention, nanowire semiconductor body 404 is composed of a first semiconductor material and has a first global crystal orientation. Meanwhile, semiconductor body 404' is composed of a second semiconductor material different from the first semiconductor material and has a second global crystal orientation different from the first global orientation.

In an embodiment, the semiconductor body 404' of the semiconductor device 400' is isolated from the crystalline substrate 402 by an isolation pedestal 430' disposed between the semiconductor body 404' and the crystalline substrate 402, as depicted in FIG. 4B'. In an embodiment, the semiconductor body 404 of the semiconductor device 400 is isolated from the crystalline substrate 402 by a buried dielectric layer 430 disposed between the semiconductor body 404 and the crystalline substrate 402, as depicted in FIG. 4B.

In an embodiment, the composition of the buried dielectric layer 430 is essentially the same as the composition of the isolation pedestal 430', e.g., both are composed of silicon dioxide. In another embodiment, however, the composition of the buried dielectric layer 430 is different from the composition of the isolation pedestal 430', e.g., the isolation pedestal 430' is composed of silicon dioxide, while the buried oxide layer 430 is composed of silicon nitride or silicon oxynitride. A further isolation portion 431, shown in FIG. 4B', may be included and may be composed of a dielectric material such as, but not limited to, silicon nitride, silicon oxide or silicon oxynitride.

The intervening dielectric portions 430, 430', or 431 may be an artifact of the fabrication process used to provide devices 400 and 400' on a common substrate. It is to be understood that although possibly present during partial fabrication, any of the intervening dielectric portions 430, 430', or 431 may be removed prior to completion of a semiconductor device. Formation of such intervening dielectric portions 430, 430', or 431 is described in greater detail below.

In an embodiment, the term "isolation pedestal" is used to covey a discrete isolation structure formed at a given time, e.g., a discrete structure formed only under a channel region, or a pair of discrete structures formed only under a pair of source and drain regions, or a discrete structure formed under a channel region as well as under a pair of source and drain regions. In another embodiment, the term "isolation pedestal" is used to covey a combination of isolation structures formed at different times, e.g., a discrete structure formed under a channel region in combination with a pair of discrete structures formed, at a different time, under a pair of source and drain regions.

In an embodiment, the crystalline substrate 402 has a global orientation the same as the second global orientation, e.g., the same as the global orientation of semiconductor body 404' of FIG. 4B'. In one such embodiment, the crystalline substrate 402 and the semiconductor material of the semiconductor body 404' are composed of a Group IV material with a (100) global orientation, while the semiconductor material of the semiconductor body 404 of device 400 is composed of a Group IV material with a (110) global orientation. The Group IV materials may include silicon, silicon germanium, or germanium. In another embodiment, the semiconductor material of the semiconductor body 404' is a Group IV material, and the semiconductor material of the semiconductor body 404 is a Group IV material or a Group III-V material.

In an embodiment (not shown), a semiconductor structure including devices 400 and 400' further includes a third semiconductor device having a third semiconductor body disposed above the crystalline substrate 402. The third semiconductor body is composed of a semiconductor material having a third global crystal orientation different from the first and second global orientations. The third semiconductor body is isolated from the crystalline substrate 402 by a second isolation pedestal disposed between the third semiconductor body and the crystalline substrate 402.

In another embodiment (not shown), a semiconductor structure including devices 400 and 400' further includes a third semiconductor device having a third semiconductor body disposed above the crystalline substrate 402. The third semiconductor body is composed of a third semiconductor material different from the first and second semiconductor materials. The third semiconductor body is isolated from the crystalline substrate 402 by a second isolation pedestal disposed between the third semiconductor body and the crystalline substrate 402. More general embodiments follow below.

Substrate 402 and, if originally formed from the substrate 402, semiconductor bodies 404 or 404' may be composed of a semiconductor material that can withstand a manufacturing process and in which charge can migrate. In an embodiment, substrate 402 is composed of a crystalline silicon, silicon/germanium or germanium layer doped with a charge carrier, such as but not limited to phosphorus, arsenic, boron or a combination thereof. In one embodiment, the concentration of silicon atoms in substrate 102 is greater than 97%. In another embodiment, substrate 402 is composed of an epitaxial layer grown atop a distinct crystalline substrate, e.g. a silicon epitaxial layer grown atop a boron-doped bulk silicon mono-crystalline substrate. Substrate 402 may also include an insulating layer disposed in between a bulk crystal substrate and an epitaxial layer to form, for example, a silicon-on-insulator substrate. In an embodiment, the insulating layer is composed of a material such as, but not limited to, silicon dioxide, silicon nitride, silicon oxy-nitride or a high-k dielectric layer. Substrate 402 may alternatively be composed of a group III-V material. In an embodiment, substrate 402 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, substrate 402 is composed of crystalline silicon and the charge-carrier dopant impurity atoms are one such as, but not limited to, boron, arsenic, indium or phosphorus. In another embodiment, substrate 402 is composed of a III-V material and the charge-carrier dopant impurity atoms are ones such as, but not limited to, carbon, silicon, germanium, oxygen, sulfur, selenium or tellurium. In another embodiment, the semiconductor substrate and, hence, the semiconductor body 404 or 404' is undoped or only lightly doped.

In an embodiment, the semiconductor device 400 or 400' is a non-planar device such as, but not limited to, a fin-FET or a tri-gate device. In such an embodiment, the semiconducting channel region is composed of or is formed in a three-dimensional body. In one such embodiment, the gate electrode stack 408 or 408' surrounds at least a top surface and a pair of sidewalls of the three-dimensional body, as depicted in FIGS. 4B and 4B'. In another embodiment, at least the channel region is made to be a discrete three-dimensional body, such as in a gate-all-around device. In one such embodiment, the gate electrode stack 408 or 408' completely surrounds the channel region.

In the case of a three-dimensional body 404 or 404', whether isolated or not, the three-dimensional body 404 or 404' may be fabricated from a bulk substrate. Alternatively, the three-dimensional body 404 or 404' may be fabricated from a starting semiconductor-on-insulator substrate. In another embodiment, the three-dimensional body 404 or 404' is formed directly from a bulk substrate and local oxidation is used to form electrically insulative underlying regions. In another alternative embodiment, the device 400 or 400' is formed directly from a bulk substrate and doping is used to form electrically isolated active regions. In one such embodiment, the an omega-FET type structure is formed.

As mentioned above, referring to FIGS. 4A, 4B and 4B', in an embodiment, the semiconductor devices 400 or 400' further include respective gate electrode stacks 408 or 408' at least partially surrounding a portion of the semiconductor body 404 or 404' of the device. In one such embodiment, the gate electrode stacks 408 or 408' each include a gate dielectric layer and a gate electrode layer (not shown). In an embodiment, the gate electrode of gate electrode stack 408 or 408' is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the semiconductor body 404 or 404'. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

In an embodiment, although not shown, the semiconductor devices 400 or 400' further include a pair of contacts at least partially surrounding respective portions of the semiconductor body 404 or 404', e.g., at least partially surrounding source and drain regions 406 or 406'. The contacts are, in an embodiment, fabricated from a metal species. The metal species may be a pure metal, such as nickel or cobalt, or may be an alloy such as a metal-metal alloy or a metal-semiconductor alloy (e.g., such as a silicide material). In an embodiment, the semiconductor devices 400 or 400' further include spacers 416 (as depicted in FIG. 4A). The spacers 416 may be disposed between the gate electrode stack 408 or 408' and a pair of contacts at least partially surrounding source and drain regions 406 or 406'. In an embodiment, the spacers 416 are composed of an insulative dielectric material such as, but not limited to, silicon dioxide, silicon oxy-nitride or silicon nitride.

Semiconductor device 400 or 400' may be any semiconductor device incorporating a gate, a channel region and a pair of source/drain regions. In an embodiment, semiconductor device 400 or 400' is one such as, but not limited to, a MOS-FET, a memory transistor, or a Microelectromechanical System (MEMS). In one embodiment, semiconductor device 400 or 400' is a three-dimensional MOS-FET and is an isolated device or is one device in a plurality of nested devices. As will be appreciated for a typical integrated circuit, both N- and P-channel transistors may be fabricated on a single substrate to form a CMOS integrated circuit, a semiconductor structure for which is described in greater detail below.

Although the device 400 or 400' described above is for a single device, e.g., an NMOS or a PMOS device, a CMOS architecture may also be formed to include both NMOS and PMOS channel devices disposed on or above the same substrate. In an embodiment, semiconductor devices 400 and 400' are formed on a common substrate. Semiconductor body isolation may, in an embodiment, be achieved by initiating fabrication on a bulk silicon substrate and patterning a fin using a spacer patterning technique by selective masking an area to be etched. The etching of the fin is performed to the depth needed for subfin isolation (e.g., an operation that sets the height as active) for a particular structure.

As an example of an approach to forming devices, such as devices 400 and 400', on a common substrate, FIGS. 5A-5I illustrate cross-sectional views representing various operations in a method of fabricating a semiconductor body-based semiconductor structure, in accordance with an embodiment of the present invention.

Figure 5A:
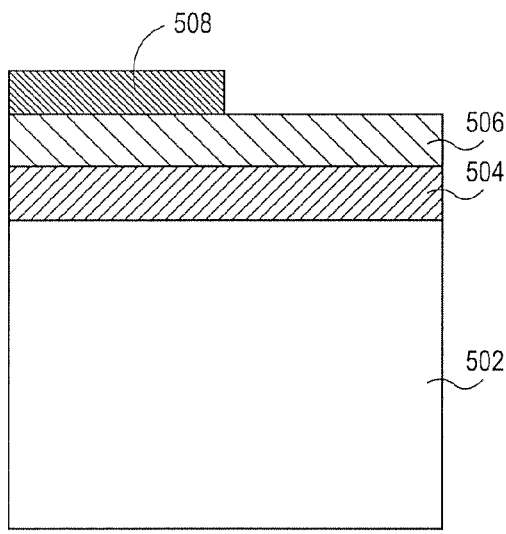

Referring to FIG. 5A, a process begins with two active layers (may be referred to as two substrates), namely a crystalline substrate 502 and a crystalline active layer 506, separated by a dielectric layer 504. In an embodiment, the substrate 502 is a (100) silicon substrate, the crystalline active layer is a (110) silicon layer, e.g. approximately 10 nanometers thick, and the dielectric layer 504 is a thin silicon dioxide (SiO$_2$) buried oxide layer (BOX layer). It is to be understood that variable BOX and/or top silicon layer thicknesses may be used as needed. Also, different types of orientation in the substrate and in the top silicon layer may be used. Substrates and layers may be strained or not strained. Materials may instead be silicon germanium (SiGe), germanium (Ge) or a III-V or other material. Substrates and layers may be doped (e.g., carbon-doped silicon, or P-doped silicon, or B-doped silicon, or may not be doped.

Figure 5B:
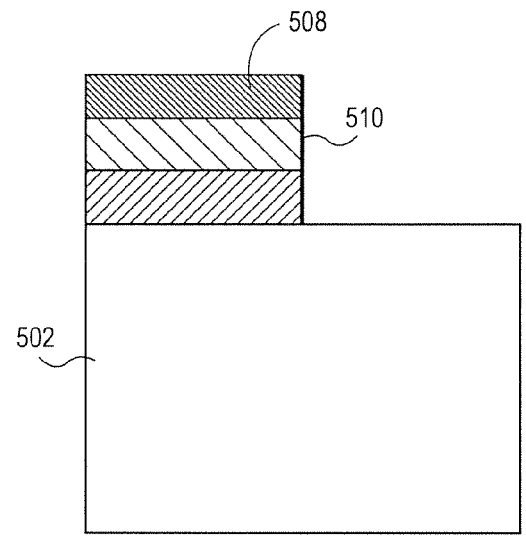
Figure 5C:
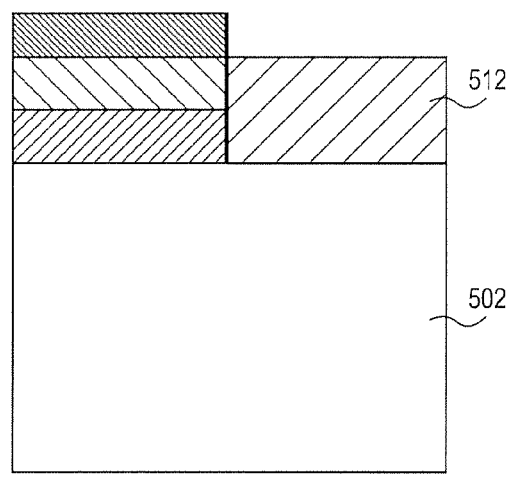
Figure 5D:
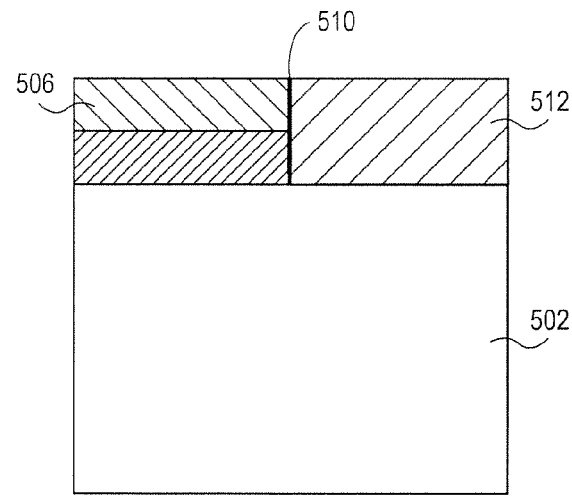

Referring again to FIG. 5A, a mask layer 508 is formed on one side of the structure. The exposed portion is then etched etch down below the dielectric layer 504. A spacer 510 is then formed, e.g., by depositing a dielectric layer and etching it, as depicted in FIG. 5B. Referring to FIG. 5C, epitaxial growth of a seed layer 512, e.g., a silicon seed layer 512, is performed on the exposed portions of substrate 502. Referring to FIG. 5D, the mask layer 508 is removed and the spacer 510 is recessed. Referring to FIG. 5E, a silicon layer 516 is epitaxilly grown as seeding from the substrate 502. The silicon layer 516 has a (100) portion and a (110) portion with, potentially, a defective zone grown at the (100) and (110) boundary. The defective zone may be etched out during subsequent fin etch.

Figure 5I:
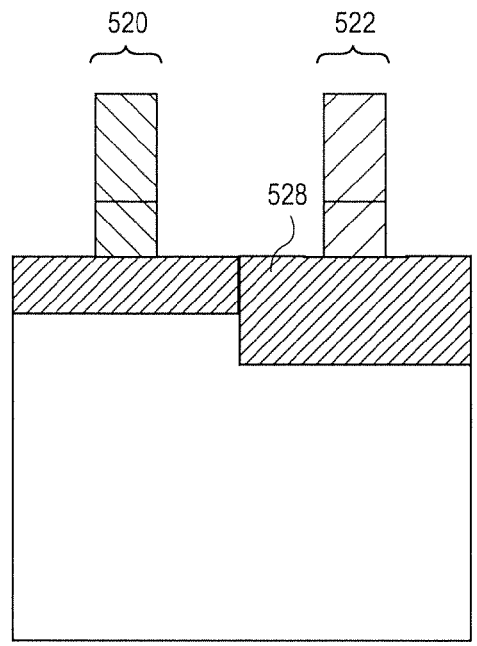

Referring to FIG. 5F, fins 520 and 522 are formed by etching using masking layer 518 formed in association with FIG. 5E. Also, spacers 524 are formed on the sidewalls of fins 520 and 522. Then, the fin 522 is etched down further to reveal substrate 502, as depicted in FIG. 5G. Referring to FIG. 5H, an under fin oxidation (UFO) process is performed to form an isolation pedestal 526 under fin 522. An additional dielectric portion 528 may be formed by deposition and planarzation (e.g., by etching) and spacers 524 and mask layer 518 may be removed, as depicted in FIG. 5I.

First and second semiconductor devices may then be formed from the first and second fins 520 and 522, respectively. In an embodiment, a PMOS device is formed from the (110) silicon fin 520, while an NMOS device is formed from the (100) silicon fin 522.

As an example of another approach to forming devices, such as devices 400 and 400', on a common substrate, FIGS. 6A-6I illustrate cross-sectional views representing various operations in a method of fabricating another semiconductor body-based semiconductor structure, in accordance with another embodiment of the present invention.

Figures 6A, 6B:
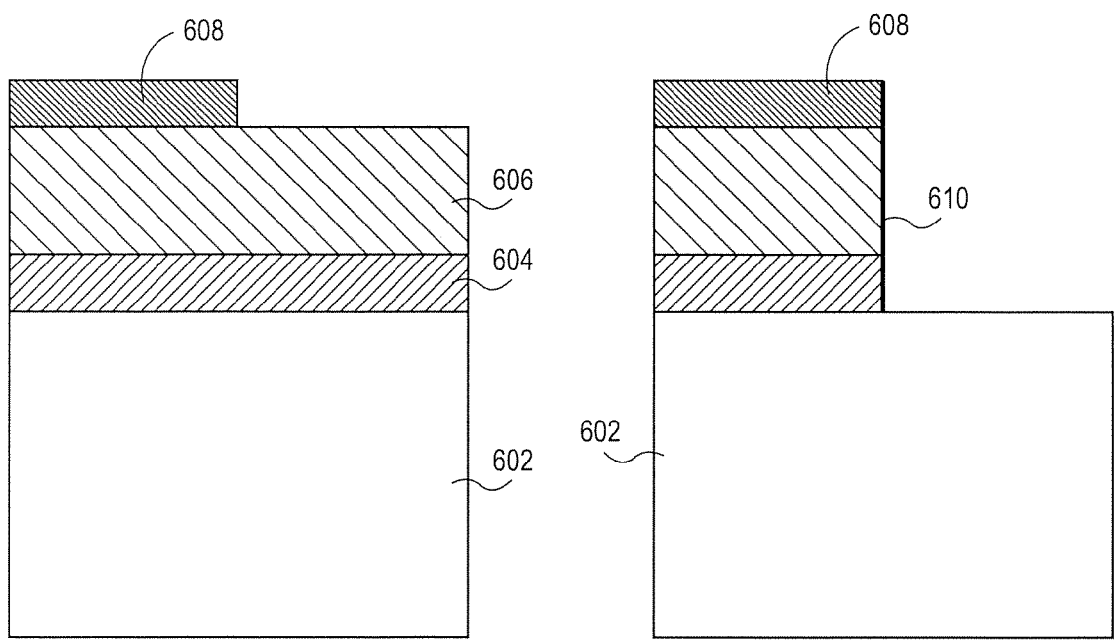
FIGS. 6A-6I illustrate cross-sectional views representing various operations in a method of fabricating another semiconductor body-based semiconductor structure, in accordance with another embodiment of the present invention.

Referring to FIG. 6A, a process begins with two active layers (may be referred to as two substrates), namely a crystalline substrate 602 and a crystalline III-V material layer 606, separated by a dielectric layer 604. In an embodiment, the substrate 602 is a (100) silicon substrate and the dielectric layer 604 is a thin silicon dioxide (SiO$_2$) buried oxide layer (BOX layer). It is to be understood that variable BOX and/or top III-V material layer thicknesses may be used as needed. Also, different types of orientation in the substrate and in the top III-V material layer may be used. Substrates and layers may be strained or not strained. Substrates and layers may be doped or may not be doped.

Figure 6C:
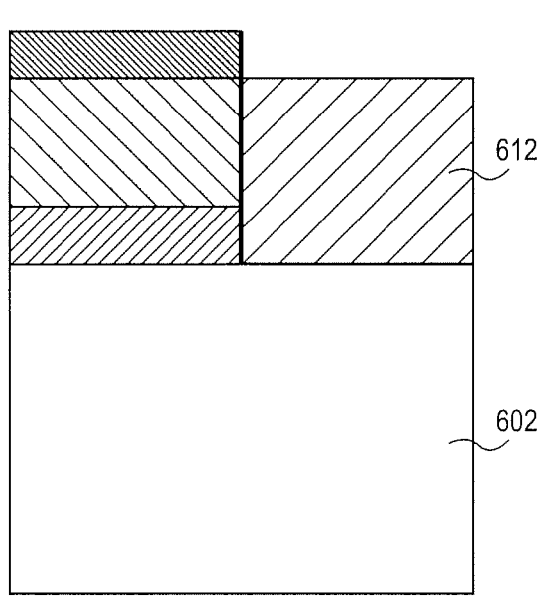
Figure 6D:
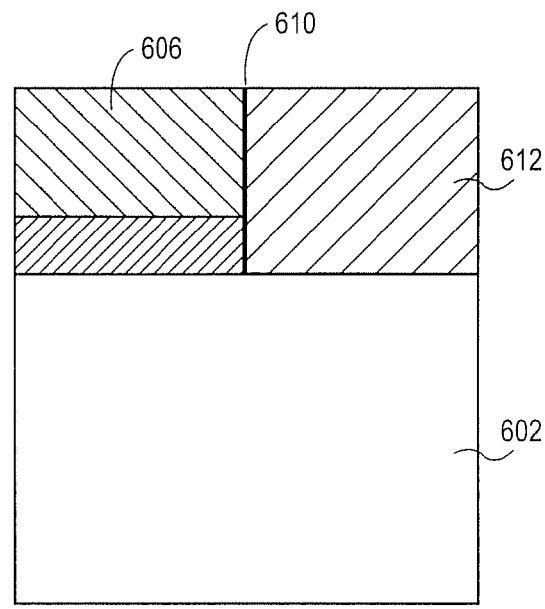

Referring again to FIG. 6A, a mask layer 608 is formed on one side of the structure. The exposed portion is then etched etch down below the dielectric layer 604. A spacer 610 is then formed, e.g., by depositing a dielectric layer and etching it, as depicted in FIG. 6B. Referring to FIG. 6C, epitaxial growth of a seed layer 612, e.g., a silicon seed layer 612, is performed on the exposed portions of substrate 602. Referring to FIG. 6D, the mask layer 608 is removed and the spacer 610 is recessed.

Figure 6E:
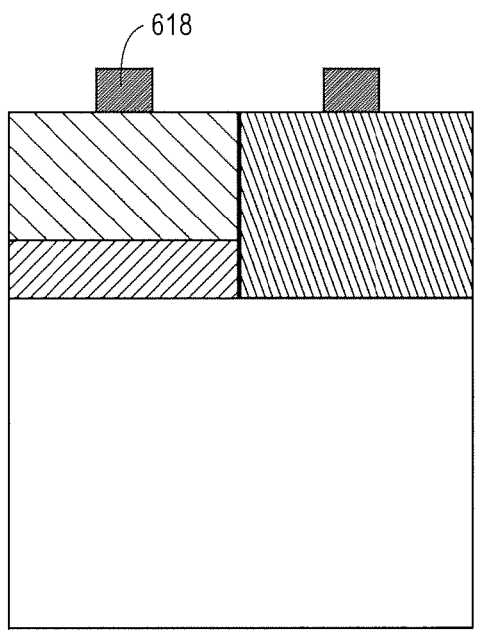
Figure 6F:
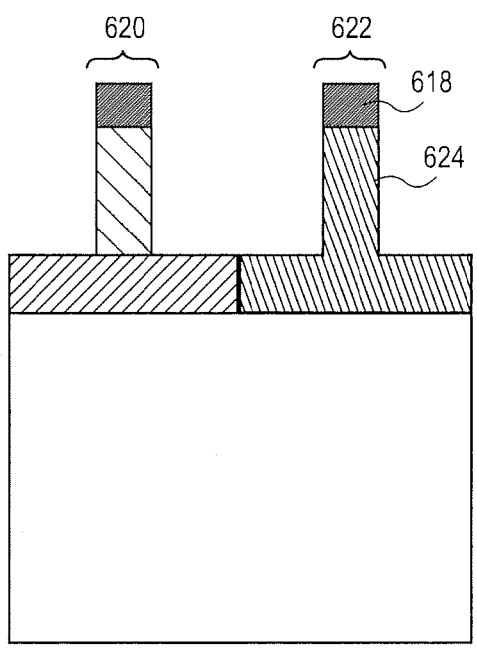
Figures 6G, 6H:
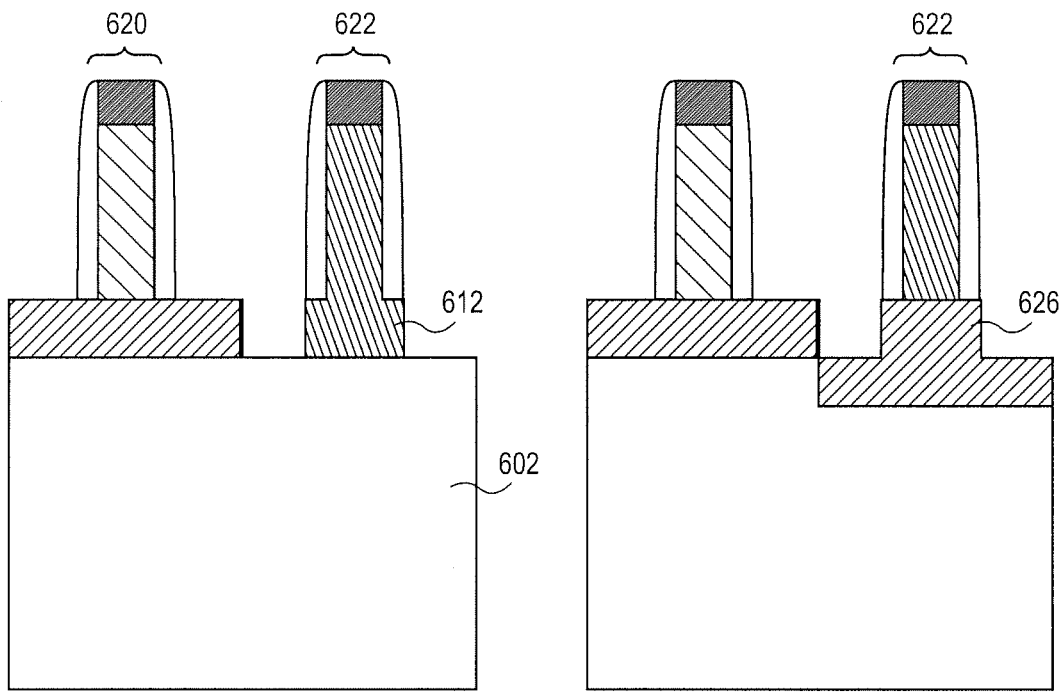
Figure 6I:
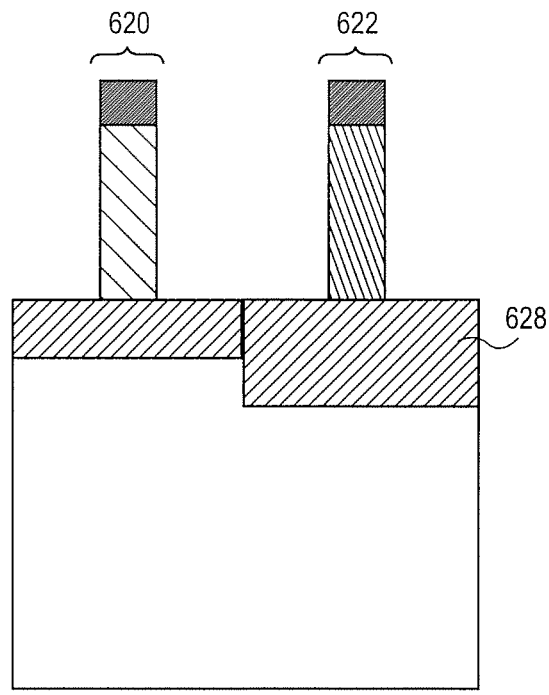

Referring to FIG. 6E, a masking layer 618 is formed. Then, fins 620 and 622 are formed by etching using masking layer 618, as depicted in FIG. 6F. Also, spacers 624 are formed on the sidewalls of fins 620 and 622. Then, the fin 622 is etched down further to reveal substrate 602, as depicted in FIG. 6G. Referring to FIG. 6H, an under fin oxidation (UFO) process is performed to form an isolation pedestal 626 under fin 622. An additional dielectric portion 628 may be formed by deposition and planarzation (e.g., by etching) and spacers 624 and mask layer 618 may be removed, as depicted in FIG. 6I.

First and second semiconductor devices may then be formed from the first and second fins 620 and 622, respectively. In an embodiment, a PMOS device is formed from the silicon fin 622, while an NMOS device is formed from the III-V fin 620. In this way, both silicon and III-V fins are formed on the same wafer. In an embodiment, this approach not only high quality silicon formation, but also defect free single crystal SiGe, Ge or III-V on the same wafer, with isolation from a bulk substrate. Many embodiments are possible with SiGe, Ge or any other substrate material disposed on an oxide wafer in the manner described above.

One or more embodiments of the present invention include use of an under fin oxide (UFO) process methodology to isolate an active diffusion area. Under conventional processing of trigate or FIN-FET transistors from bulk silicon substrates, sub-FIN leakage of the resulting devices may occur. Such leakage may render difficult the targeting and controlling of $I_{off}$ (off-state source and drain leakage). The leakage may be effectively suppressed by the introduction of an insulating layer at the bottom of the fin, in the area that has poor or no gate control. Thus, in an embodiment, and as described above, the introduction of an insulating material may enable an easy targeting of channel doping reduction to achieve a lightly doped or fully undoped channel device. Having a buried oxide in the sub-fin region may also relax the conflicting constraints and simultaneously enable a low-doped fin with high mobility, excellent device electrostatics and elimination of the substrate junction leakage. Also, the presence of an oxide under the source and drain regions may significantly reduce junction leakage. The process flows described herein may be applicable to nanowire, tri-gate and fin-FET type devices, or subsets thereof such as omega-gate, pi gate or fin with gate all around transistors.

One or more embodiments of the present invention provide a "cost-effective" solution to improving transistor performance and reducing stand-by power, e.g., for system-on-chip (SOC) ultra-low power devices which are limited by junction leakage in standby mode. Although such benefits may also be achieved by doping very highly the subfin region, such doping is difficult to perform without affecting the channel doping and, hence, impacting mobility. Alternatively, a prefabricated SOI substrate may be used but typically requires higher fabrication costs. Accordingly, one ore more embodiments involve the fabrication of, e.g., nanowires fin-FETs or trigate devices based on fins with an isolation pedestal and/or a buried oxide layer. In one such embodiment, the isolation pedestal or buried oxide layer isolates the active fin channel from the underlying substrate. Such approaches may be cost-effective solutions since they may begin with bulk substrates and the isolating of the active fin from the substrate may be performed using localized oxidation in the subfin region.

Figure 7:
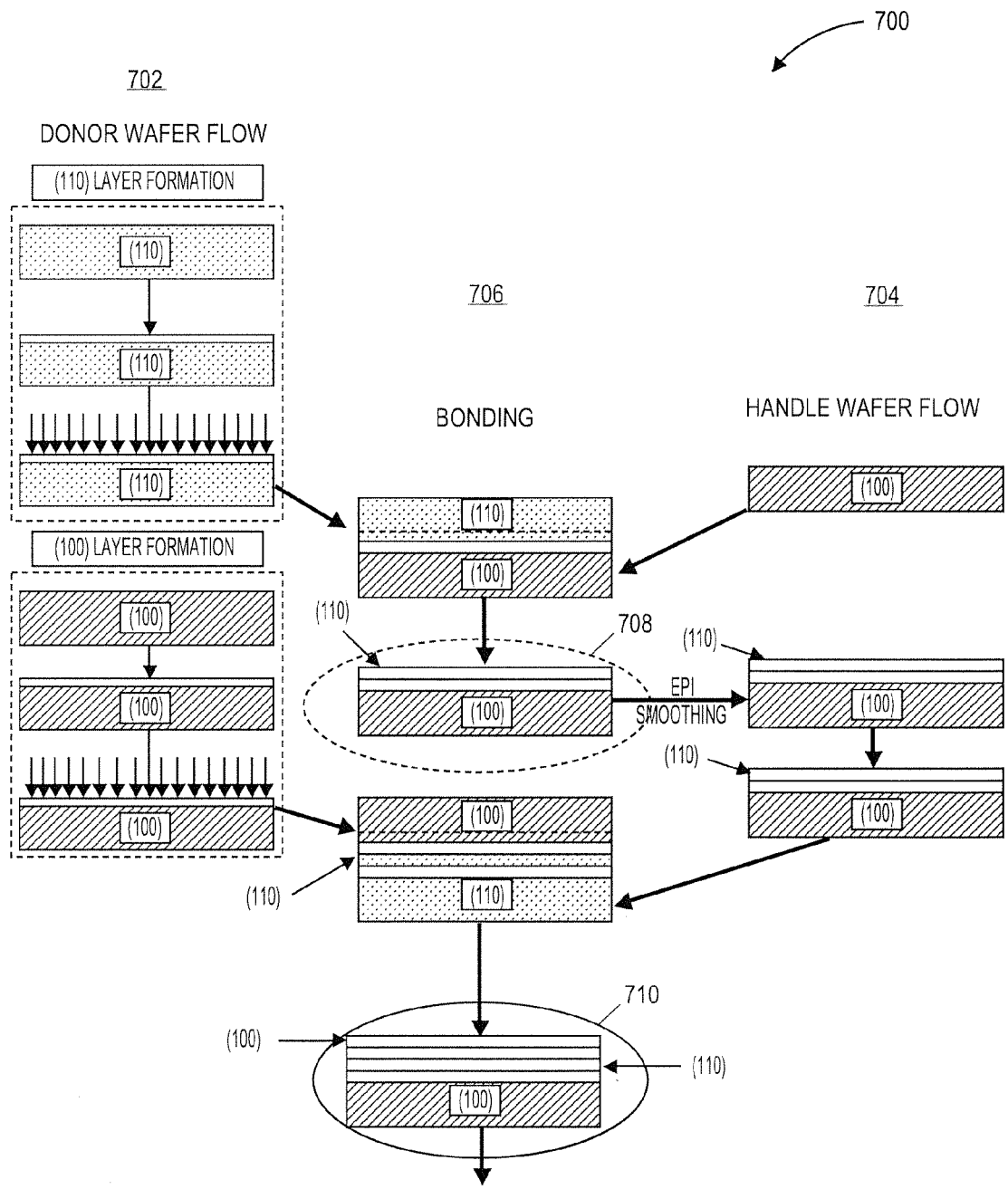
FIG. 7 illustrates exemplary process flows for forming a wafer having a crystalline substrate and one or more separate crystalline active layers, in accordance with an embodiment of the present invention.

FIG. 7 illustrates exemplary process flows for forming a wafer having a crystalline substrate and one or more separate crystalline active layers, in accordance with an embodiment of the present invention. Referring to FIG. 7, process flow 700 is based on a silicon-on-insulator (SOI) approach and includes a donor wafer flow 702, a handle wafer flow 704, and a bonding flow 706. In one embodiment, a wafer 708 having a crystalline substrate and one separate crystalline active layer is formed (also referred to as a two substrate wafer). In another embodiment, a wafer 710 having a crystalline substrate and two separate crystalline active layers is formed (also referred to as a three substrate wafer).

Figure 8:
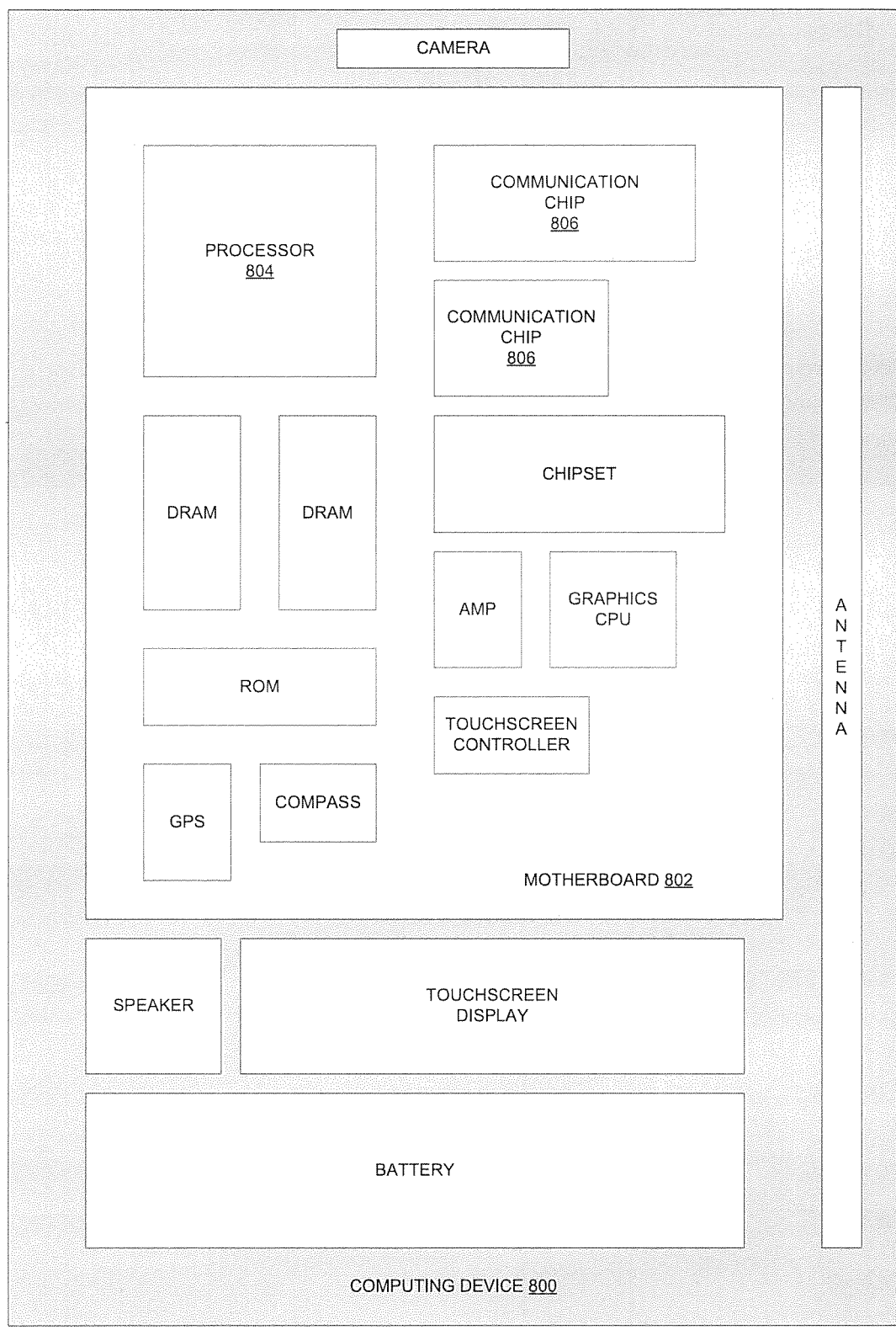
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more devices, such as MOS-FET transistors built in accordance with implementations of the invention.

In further implementations, another component housed within the computing device 800 may contain an integrated circuit die that includes one or more devices, such as MOS-FET transistors built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, common-substrate semiconductor devices having nanowires or semiconductor bodies with differing material orientation or composition and methods to form such common-substrate devices have been disclosed. In an embodiment, a semiconductor structure includes a first semiconductor device having a first nanowire or semiconductor body disposed above a crystalline substrate. The first nanowire or semiconductor body is composed of a semiconductor material having a first global crystal orientation. The semiconductor structure also includes a second semiconductor device having a second nanowire or semiconductor body disposed above the crystalline substrate. The second nanowire or semiconductor body is composed of a semiconductor material having a second global crystal orientation different from the first global orientation. The second nanowire or semiconductor body is isolated from the crystalline substrate by an isolation pedestal disposed between the second nanowire or semiconductor body and the crystalline substrate. In another embodiment, a semiconductor structure includes a first semiconductor device having a first nanowire or semiconductor body disposed above a crystalline substrate. The first nanowire or semiconductor body is composed of a first semiconductor material. The semiconductor structure also includes a second semiconductor device having a second nanowire or semiconductor body disposed above the crystalline substrate. The second nanowire or semiconductor body is composed of a second semiconductor material different from the first semiconductor material. The second nanowire or semiconductor body is isolated from the crystalline substrate by an isolation pedestal disposed between the second nanowire or semiconductor body and the crystalline substrate.

What is claimed is:
1. A semiconductor structure, comprising:
a first semiconductor device comprising a first nanowire disposed above a crystalline substrate, the first nanowire comprising a first semiconductor material;
a second semiconductor device comprising a second nanowire disposed above the crystalline substrate, the second nanowire comprising a second semiconductor material different from the first semiconductor material, and the second nanowire isolated from the crystalline substrate by an isolation pedestal disposed between the second nanowire and the crystalline substrate; and a third semiconductor device comprising a third nanowire disposed above the crystalline substrate, the third nanowire comprising a third semiconductor material different from the first and second semiconductor materials, the third nanowire isolated from the crystalline substrate by a second isolation pedestal disposed between the third nanowire and the crystalline substrate, wherein a bottom surface of the first nanowire is co-planar with a bottom surface of the second nanowire and is co-planar with a bottom surface of the third nanowire, and wherein the first nanowire, the second nanowire and the third nanowire are all parallel with one another.

2. The semiconductor structure of claim 1, wherein the first nanowire of the first semiconductor device is isolated from the crystalline substrate by a buried dielectric layer disposed between the first nanowire and the crystalline substrate.

3. The semiconductor structure of claim 2, wherein a composition of the buried dielectric layer is essentially the same as a composition of the isolation pedestal.

4. The semiconductor structure of claim 2, wherein a composition of the buried dielectric layer is different from a composition of the isolation pedestal.

5. The semiconductor structure of claim 1, wherein the first semiconductor device further comprises one or more additional nanowires disposed above and stacked in a vertical plane with the first nanowire, the second semiconductor device further comprises one or more additional nanowires disposed above and stacked in a vertical plane with the second nanowire, and the third semiconductor device further comprises one or more additional nanowires disposed above and stacked in a vertical plane with the third nanowire.

6. The semiconductor structure of claim 1, wherein the first semiconductor device further comprises a first gate electrode stack surrounding a portion of the first nanowire, the second semiconductor device further comprises a second gate electrode stack surrounding a portion of the second nanowire, and the third semiconductor device further comprises a third gate electrode stack surrounding a portion of the third nanowire.

7. A semiconductor structure, comprising:
a first semiconductor device comprising a first semiconductor body disposed above a crystalline substrate, the first semiconductor body comprising a first semiconductor material;

a second semiconductor device comprising a second semiconductor body disposed above the crystalline substrate, the second semiconductor body comprising a second semiconductor material different from the first semiconductor material, and the second semiconductor body isolated from the crystalline substrate by an isolation pedestal disposed between the second semiconductor body and the crystalline substrate; and a third semiconductor device comprising a third semiconductor body disposed above the crystalline substrate, the third semiconductor body comprising a third semiconductor material different from the first and second semiconductor materials, the third semiconductor body isolated from the crystalline substrate by a second isolation pedestal disposed between the third semiconductor body and the crystalline substrate, wherein a bottom surface of the first semiconductor body is co-planar with a bottom surface of the second semiconductor body and is co-planar with a bottom surface of the third semiconductor body, and wherein the first semiconductor body, the second semiconductor body and the third semiconductor body are all parallel with one another.

8. The semiconductor structure of claim 7, wherein the first semiconductor body of the first semiconductor device is isolated from the crystalline substrate by a buried dielectric layer disposed between the first semiconductor body and the crystalline substrate.

9. The semiconductor structure of claim 8, wherein a composition of the buried dielectric layer is essentially the same as a composition of the isolation pedestal.

10. The semiconductor structure of claim 8, wherein a composition of the buried dielectric layer is different from a composition of the isolation pedestal.

11. The semiconductor structure of claim 7, wherein the first semiconductor device further comprises a first gate electrode stack surrounding a portion of the first semiconductor body, the second semiconductor device further comprises a second gate electrode stack surrounding a portion of the second semiconductor body, and the third semiconductor device further comprises a third gate electrode stack surrounding a portion of the third semiconductor body.

* * * * *